United States Patent
Takahashi

(10) Patent No.: US 10,491,866 B2
(45) Date of Patent: Nov. 26, 2019

(54) ACTUATOR CONTROLLING DEVICE, DRIVE SYSTEM, VIDEO DEVICE, IMAGE PROJECTION DEVICE, AND ACTUATOR CONTROLLING METHOD

(71) Applicant: Hiroyuki Takahashi, Miyagi (JP)

(72) Inventor: Hiroyuki Takahashi, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 309 days.

(21) Appl. No.: 15/247,062

(22) Filed: Aug. 25, 2016

(65) Prior Publication Data

US 2017/0064264 A1    Mar. 2, 2017

(30) Foreign Application Priority Data

Aug. 26, 2015  (JP) .................................. 2015-167237
Jul. 8, 2016    (JP) .................................. 2016-136288

(51) Int. Cl.
*G02B 26/08* (2006.01)
*H04N 9/31* (2006.01)

(52) U.S. Cl.
CPC ............. *H04N 9/31* (2013.01); *H04N 9/3194* (2013.01)

(58) Field of Classification Search
CPC ........ H04N 9/31; H04N 9/3194; B81B 7/008; G02B 26/0858; G02B 26/01; G02B 26/105; G02B 26/101; H01L 41/042
USPC ...................................................... 359/200.8
See application file for complete search history.

(56) References Cited

U.S. PATENT DOCUMENTS

| 4,482,987 A * | 11/1984 | Okada ...................... G11B 7/09 |
| | | 250/202 |
| 5,245,463 A | 9/1993 | Goto |
| 5,444,565 A | 8/1995 | Goto |
| 7,924,486 B2 | 4/2011 | Yen et al. |
| 2004/0207290 A1 | 10/2004 | Okada |
| 2005/0122069 A1 | 6/2005 | Okada |
| 2008/0180633 A1 | 7/2008 | Yamada et al. |

(Continued)

FOREIGN PATENT DOCUMENTS

| JP | 2570237 | 10/1996 |
| JP | 2921218 | 4/1999 |

(Continued)

OTHER PUBLICATIONS

Extended European Search Report dated Jan. 5, 2017 in Patent Application No. 16185696.8.

*Primary Examiner* — Euncha P Cherry
(74) *Attorney, Agent, or Firm* — Oblon, McClelland, Maier & Neustadt, L.L.P.

(57) ABSTRACT

An actuator controlling device controls an actuator based on signals acquired from a photodetector. The actuator includes a drive unit that causes a reflecting part to move. The actuator controlling device includes a waveform generating unit, a driving amplifier, a power supply unit, and a controller. The waveform generating unit generates a voltage waveform for driving the drive unit. The driving amplifier amplifies the voltage waveform generated by the waveform generating unit. The power supply unit supplies power to the driving amplifier. The controller acquires detection signals from the photodetector and controls, based on the acquired detection signals, voltage to be supplied from the power supply unit to the driving amplifier.

11 Claims, 27 Drawing Sheets

(56) References Cited

U.S. PATENT DOCUMENTS

| | | | |
|---|---|---|---|
| 2009/0256973 A1* | 10/2009 | Bazzani | G09G 3/3426 |
| | | | 348/744 |
| 2012/0113492 A1 | 5/2012 | Nakazono et al. | |
| 2014/0341007 A1* | 11/2014 | Sano | G11B 7/005 |
| | | | 369/47.17 |
| 2016/0170202 A1* | 6/2016 | Yasuda | B81C 3/00 |
| | | | 356/4.01 |
| 2016/0212394 A1 | 7/2016 | Nakahara et al. | |
| 2016/0238835 A1* | 8/2016 | Saito | G02B 26/0858 |

FOREIGN PATENT DOCUMENTS

| | | |
|---|---|---|
| JP | 3804312 | 5/2006 |
| JP | 2007-155984 | 6/2007 |
| JP | 2007-226108 | 9/2007 |
| JP | 2007-240626 | 9/2007 |
| JP | 2007-241169 | 9/2007 |
| JP | 2008-116668 | 5/2008 |
| JP | 2010-026443 | 2/2010 |
| JP | 2011-004339 | 1/2011 |
| JP | 2012-168444 | 9/2012 |
| JP | 2014-132976 | 7/2014 |
| WO | WO 2015/029493 A1 | 3/2015 |

\* cited by examiner

ACTUATOR CONTROLLING DEVICE, DRIVE SYSTEM, VIDEO DEVICE, IMAGE PROJECTION DEVICE, AND ACTUATOR CONTROLLING METHOD

CROSS-REFERENCE TO RELATED APPLICATIONS

The present application claims priority under 35 U.S.C. § 119 to Japanese Patent Application No. 2015-167237, filed on Aug. 26, 2015 and Japanese Patent Application No. 2016-136288, filed on Jul. 8, 2016. The contents of which are incorporated herein by reference in their entirety.

BACKGROUND OF THE INVENTION

1. Field of the Invention

The present invention relates to an actuator controlling device, a drive system, video device, an image projection device, and an actuator controlling method.

2. Description of the Related Art

A piezoelectric element is known to exert a so-called inverse piezoelectric effect that when applied with voltage in a direction of electrodes, deforms, i.e., contracts in proportion to an electrical potential of the applied voltage. Conventionally, there is developed a piezoelectric actuator that transmits a driving force to a driven body by using such a piezoelectric element.

A piezoelectric element used in a piezoelectric actuator exerts a driving force in a state of being polarized in one direction, for example, like a permanent magnet; its driving force can be obtained by connecting the output of a drive circuit to between electrodes installed on both end faces of the piezoelectric element in a polarization direction. The above-mentioned polarization is obtained by continuing to apply a constant voltage for a predetermined period of time in consideration of the composition of the element. The element which has had polarization is driven by being applied with voltage in between a direction of the voltage that has caused the polarization and zero in general.

In general, there is an inconvenience such that the driving sensitivity of piezoelectric elements in an actuator in relation to voltage applied thereon (for the same notion, hereinafter referred to as the driving sensitivity of an actuator) changes by an manufacturing error, aging degradation, and a surrounding environmental condition such as a temperature and therefore varies among devices. Among devices various in driving sensitivity, there may be a device in which the driving sensitivity deviates from a normal range in relation to applied voltage. Therefore, there are potential troubles such that the devices have different display positions and such that the aspect ratio of images is not normal.

SUMMARY OF THE INVENTION

According to one aspect of the present invention, an actuator controlling device controls an actuator based on signals acquired from a photodetector. The actuator includes a drive unit that causes a reflecting part to move. The actuator controlling device includes a waveform generating unit, a driving amplifier, a power supply unit, and a controller. The waveform generating unit generates a voltage waveform for driving the drive unit. The driving amplifier amplifies the voltage waveform generated by the waveform generating unit. The power supply unit supplies power to the driving amplifier. The controller acquires detection signals from the photodetector and controls, based on the acquired detection signals, voltage to be supplied from the power supply unit to the driving amplifier.

BRIEF DESCRIPTION OF THE DRAWINGS

The accompanying drawings are intended to depict exemplary embodiments of the present invention and should not be interpreted to limit the scope thereof. Identical or similar reference numerals designate identical or similar components throughout the various drawings.

DETAILED DESCRIPTION OF THE PREFERRED EMBODIMENTS

Figure 1:
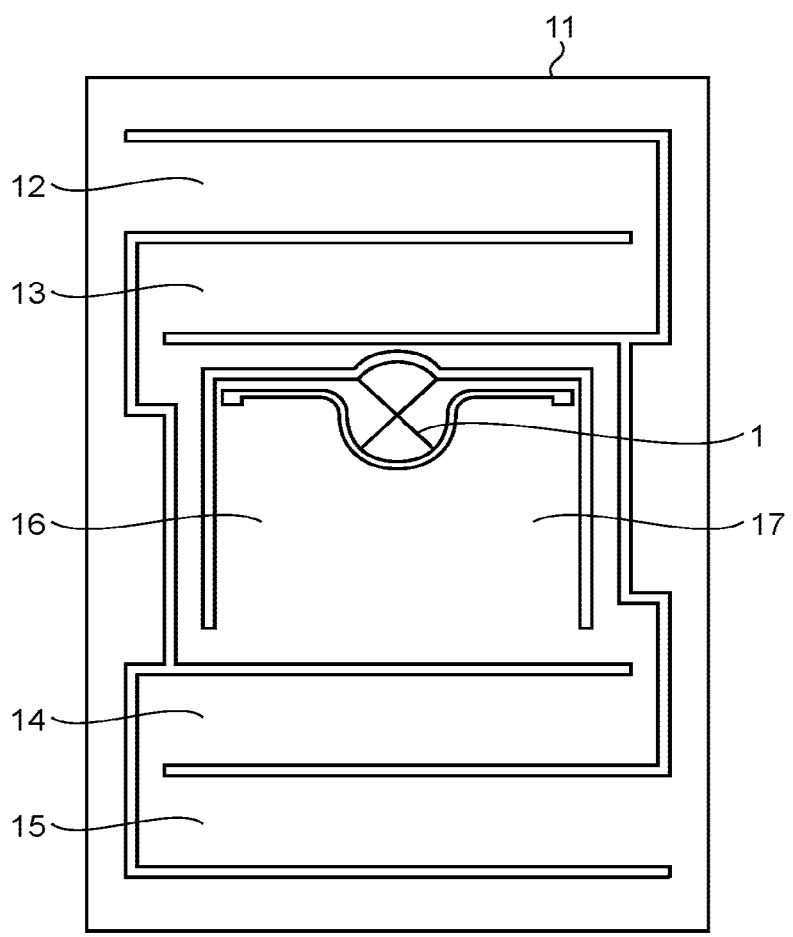
FIG. 1 is a diagram illustrating an example of the configuration of a frame of a piezoelectric actuator.

The terminology used herein is for the purpose of describing particular embodiments only and is not intended to be limiting of the present invention.

As used herein, the singular forms "a", an and the are intended to include the plural forms as well, unless the context clearly indicates otherwise.

In describing preferred embodiments illustrated in the drawings, specific terminology may be employed for the sake of clarity. However, the disclosure of this patent specification is not intended to be limited to the specific terminology so selected, and it is to be understood that each specific element includes all technical equivalents that have the same function, operate in a similar manner, and achieve a similar result.

An embodiment of the present invention will be described in detail below with reference to the drawings.

An object of an embodiment is to provide an actuator controlling device, a drive system, video device, an image projection device, and an actuator controlling method that are capable of reducing variation in driving sensitivity among actuators.

Exemplary embodiments of the present invention will be described in detail below on the basis of accompanying drawings. Incidentally, the embodiments described below are preferred embodiments of the present invention, and therefore various technically preferred limitations are put thereon; however, the scope of the present invention is not unjustly limited by the following description, and all the configurations described in the embodiments are not constituent elements essential for the present invention.

Figure 2:
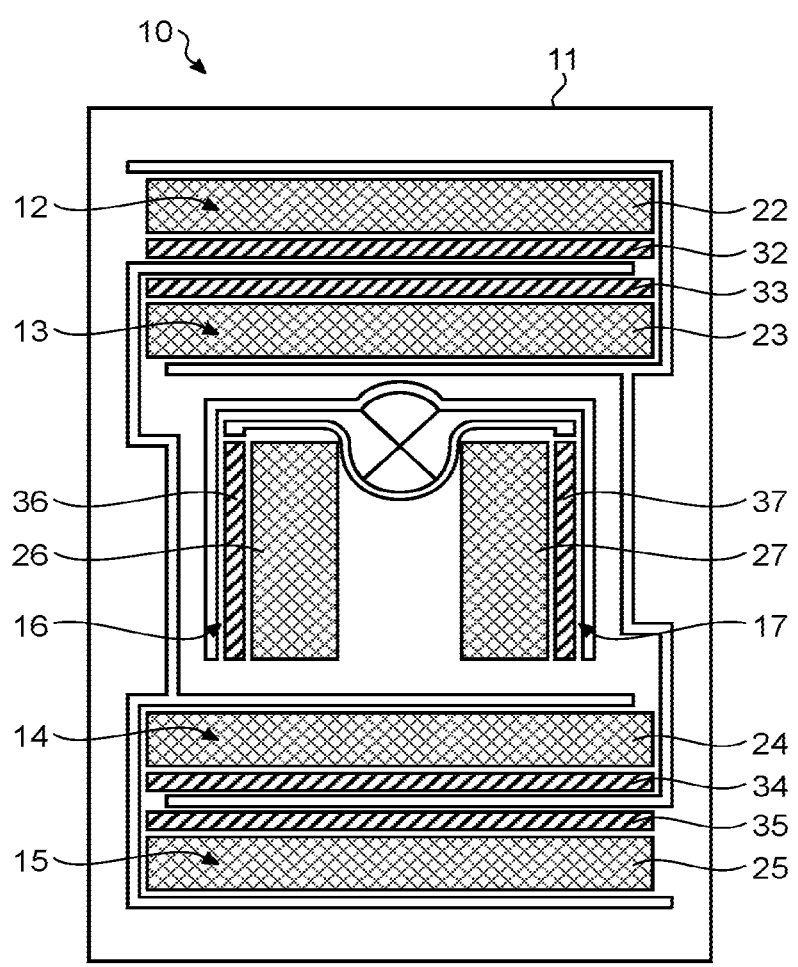
FIG. 2 is a diagram illustrating an example of the arrangement of piezoelectric elements in the piezoelectric actuator.
Figure 3:
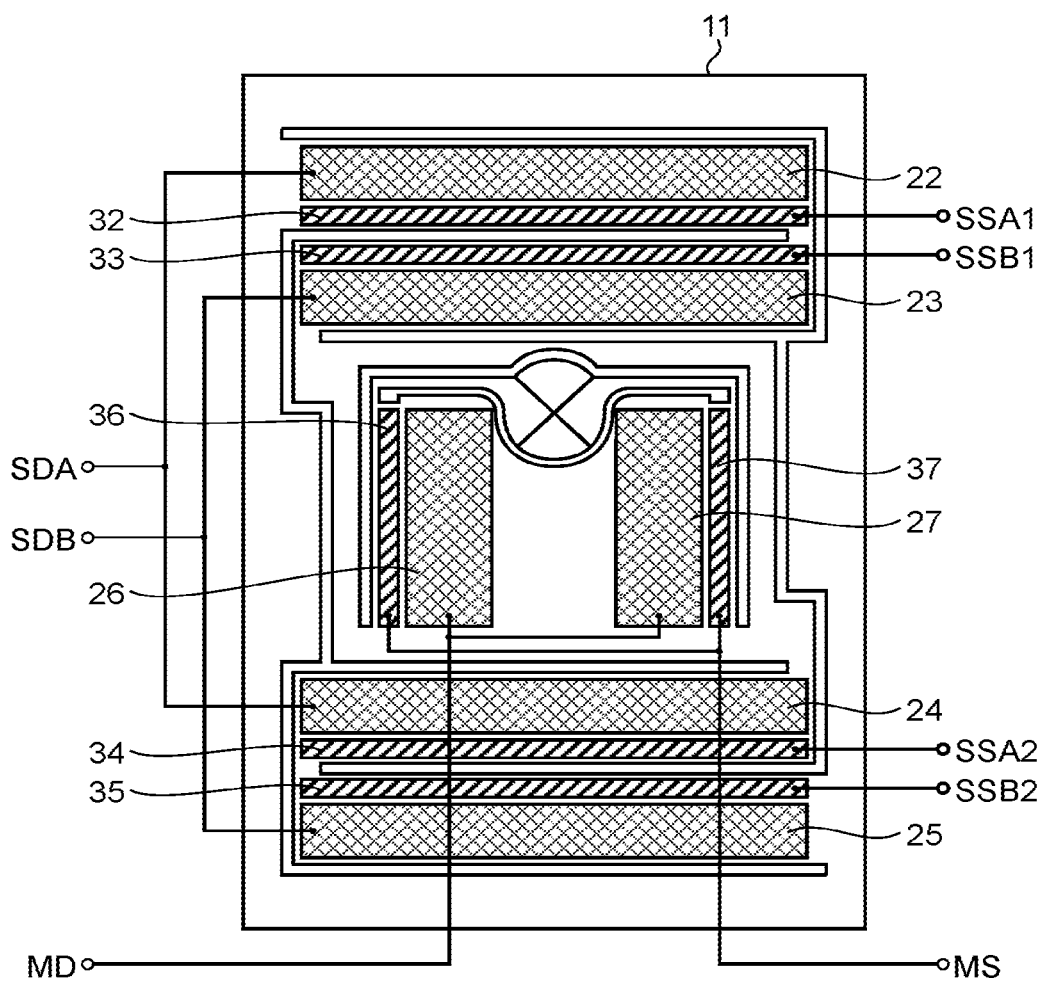
FIG. 3 is a diagram illustrating an example of connections to the piezoelectric actuator.

Here, the structural example and operation of a piezoelectric actuator will be explained below as an example. FIG. 1 is a diagram illustrating an example of a frame configuration of the piezoelectric actuator. FIG. 2 is a diagram illustrating an example of the arrangement of piezoelectric elements in the frame illustrated in FIG. 1. FIG. 3 is a diagram illustrating an example of the wiring to the piezoelectric actuator illustrated in FIG. 2. The piezoelectric actuator illustrated in FIGS. 1 to 3 is an actuator for scanning a light in two axial directions: an X-axis direction and a Y-axis direction.

As illustrated in FIG. 1, the frame configuration of the piezoelectric actuator has a structure in which a mirror 1 is attached to a frame 11 of the piezoelectric actuator formed on a silicon substrate. The frame 11 includes turn structure parts 12 to 15 and X-axis frames 16 and 17. The left side of the turn structure part 12 is a part connecting to the frame 11; the left side of the turn structure part 13 is a part connecting to the X-axis frames 16 and 17; the right side of the turn structure part 14 is a part connecting to the X-axis frames 16 and 17; and the right side of the turn structure part 15 is a part connecting to the frame 11. FIG. 1 illustrates an example in which the number of turns of each of the turn structure parts 12 to 15 is one; however, the turn structure can be configured to have two or more turns. The turn structure parts 12 to 15 rotate the X-axis frames 16 and 17 in a direction of twisting the entire X-axis frames 16 and 17. The mirror 1 is installed in the rotating center of the X-axis frames 16 and 17, and scans an emitted light, such as a laser beam. In FIG. 1, the Y-axis direction of the scanning is a direction perpendicular to a vertical center line through the mirror 1, i.e., a crosswise direction. The X-axis frames 16 and 17 are also connected to the mirror 1. In FIG. 1, the X-axis direction of the scanning is a direction perpendicular to a horizontal center line through the mirror 1, i.e., a vertical direction. Therefore, in the case of FIG. 1, the vertical direction of the plane of drawing is the X-axis, and the crosswise direction is the Y-axis.

As illustrated in FIG. 2, a piezoelectric actuator 10 has a structure in which driving piezoelectric elements 22 to 25 and detection piezoelectric elements 32 to 35 are disposed on the turn structure parts 12 to 15 of the frame 11 illustrated in FIG. 1, respectively. Furthermore, driving piezoelectric elements 26 and 27 and detection piezoelectric elements 36 and 37 are disposed on the X-axis frames 16 and 17, respectively.

As illustrated in FIG. 3, wiring SDA (Sub Drive Ach) for driving the piezoelectric elements 22 and 24, wiring SDB (Sub Drive Bch) for driving the piezoelectric elements 23 and 25, wiring MD (Main Drive) for driving the piezoelectric elements 26 and 27, a detection terminal SSA1 (Sub Sense Ach-1) coupled to the turn structure part 12, a detection terminal SSB1 (Sub Sense Bch-1) coupled to the turn structure part 13, a detection terminal SSA2 (Sub Sense Ach-2) coupled to the turn structure part 14, and a detection terminal SSB2 (Sub Sense Bch-2) coupled to the turn structure part 15 are disposed on the piezoelectric actuator 10 illustrated in FIG. 2.

Figure 4:
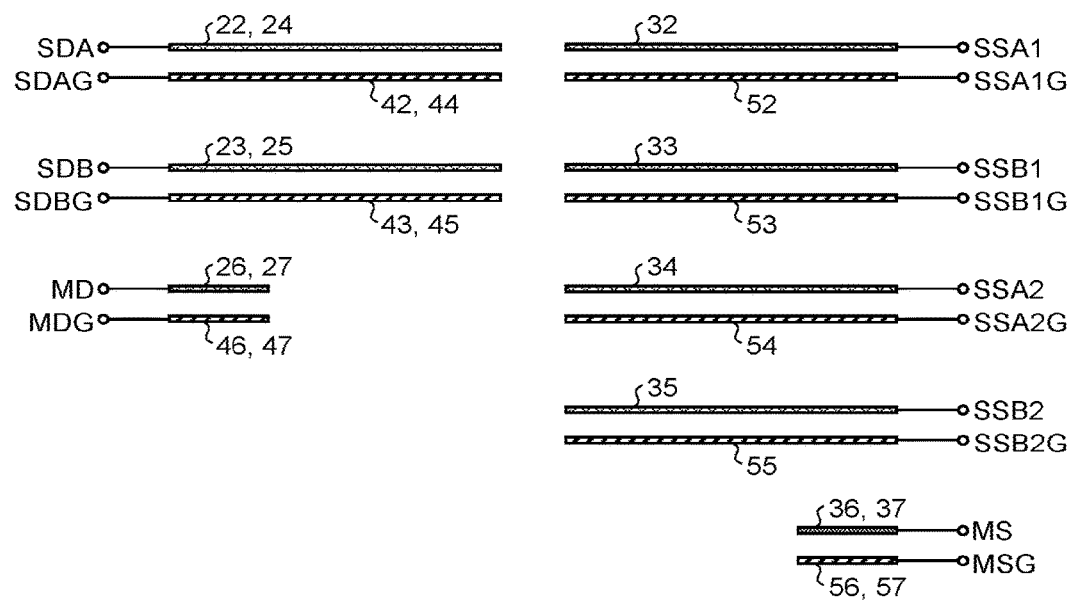
FIG. 4 is a diagram illustrating an example of an arrangement of the piezoelectric actuator and electrodes.

FIG. 4 illustrates an example of the combination of each piezoelectric element illustrated in FIG. 2 and an electrode disposed on the back surface of the piezoelectric element and wiring coupled to the electrode. As illustrated in FIG. 4, electrodes 42 and 44 coupled to common wiring SDAG are arranged on the back surfaces of the driving piezoelectric elements 22 and 24; electrodes 43 and 45 coupled to common wiring SDBG are arranged on the back surfaces of the piezoelectric elements 23 and 25; and electrodes 46 and 47 coupled to common wiring MDG are arranged on the back surfaces of the piezoelectric elements 26 and 27. Furthermore, an electrode 52 coupled to wiring SSA1G is arranged on the back surface of the detection piezoelectric element 32; an electrode 53 coupled to wiring SSB1G is arranged on the back surface of the piezoelectric element 33; an electrode 54 coupled to wiring SSA2G is arranged on the back surface of the piezoelectric element 34; an electrode 55 coupled to wiring SSB2G is arranged on the back surface of the piezoelectric element 35; and electrodes 56 and 57 coupled to common wiring MSG are arranged on the back surfaces of the piezoelectric elements 36 and 37.

Generally, if a voltage of the same polarity as the voltage applied at the time of polarization is applied to a piezoelectric element, a pull force is generated in the piezoelectric element. For example, if a voltage of GND-based +30 V is applied at the time of polarization, by applying a voltage of GND-based positive polarity, the entire piezoelectric element deforms in a contracting direction. This generates a pull force in the piezoelectric element. Furthermore, if a force is put on the piezoelectric element, a weak voltage is generated. This voltage makes the piezoelectric element charged, and an electric current flows between the piezoelectric element and an electrode. Using these characteristics, the piezoelectric elements 22 to 27 and the piezoelectric elements 32 to 37 perform the driving and detection.

FIGS. 1 to 4 illustrate the case where the piezoelectric elements are arranged on only one of the surfaces; alternatively, the piezoelectric elements can be arranged on both surfaces in order to improve the flexibility in the creation of routing of layout or piezoelectric elements. Furthermore, the formation of these piezoelectric elements and electrodes roughly conforms to semiconductor processes, and therefore it is possible to achieve the cost reduction resulting from the mass production.

Figure 5:
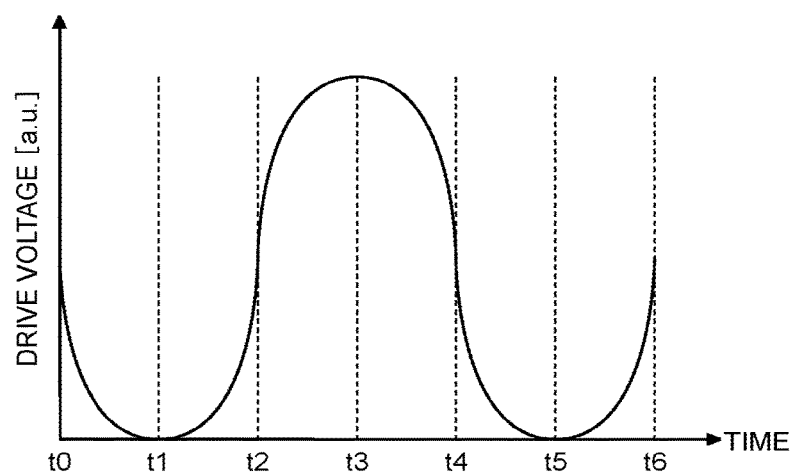
FIG. 5 is a graph representing drive voltage in the X-axis side of the piezoelectric actuator.
Figure 6:
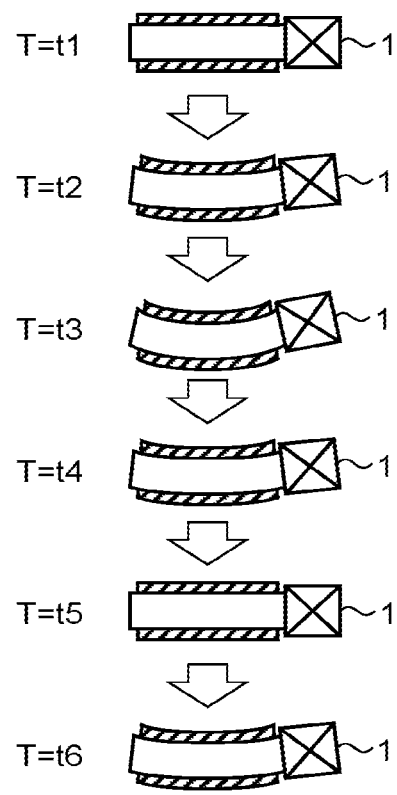
FIG. 6 is a schematic diagram depicting movements of the piezoelectric actuator in response to the drive voltage represented in FIG. 5.

FIG. 5 is a diagram explaining the operation of the piezoelectric actuator 10 in the X-axis direction. FIG. 6 is a diagram of the piezoelectric actuator 10 viewed from the side. Generally, a piezoelectric actuator is operated in the X-axis direction by resonance in order to obtain as large amplitude as possible with low input energy. Therefore, in FIGS. 5 and 6, the piezoelectric actuator 10 is operated at resonant frequency. As illustrated in FIG. 5, at time t1, a voltage between the electrodes MD and MDG is zero. In the piezoelectric actuator 10 at this time t1, as illustrated in FIG. 6, a displacement of piezoelectric elements on the left side of the mirror 1 is zero. At time t2, the piezoelectric elements deform in a direction of contracting in the center thereof, thereby the center of the mirror 1 slightly tilts to the left. At time t3, the contraction of the piezoelectric elements reaches a maximum, as a result, the center of the mirror 1 tilts to the left at the maximum. In this way, the piezoelectric actuator 10 operates in the X-axis direction.

Figure 7:
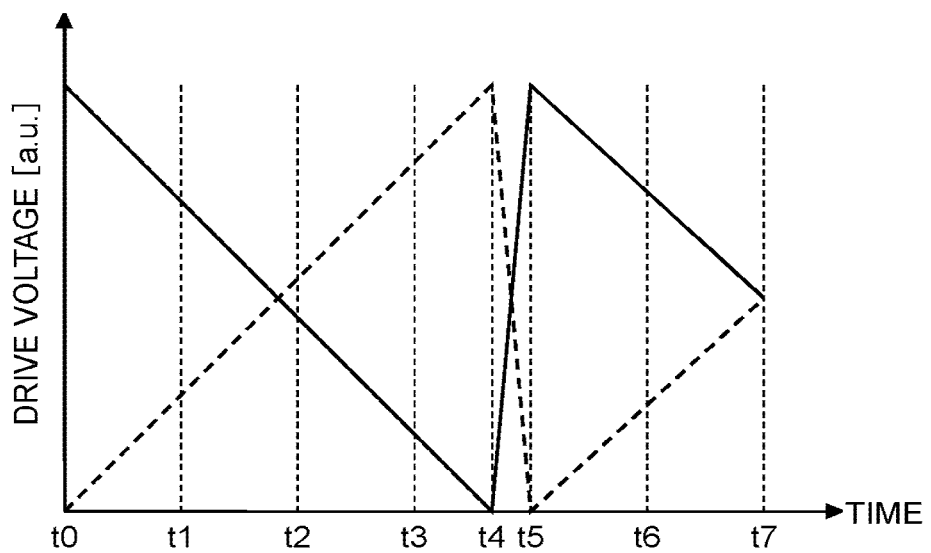
FIG. 7 is a graph representing drive voltage in the Y-axis side of the piezoelectric actuator.
Figure 8:
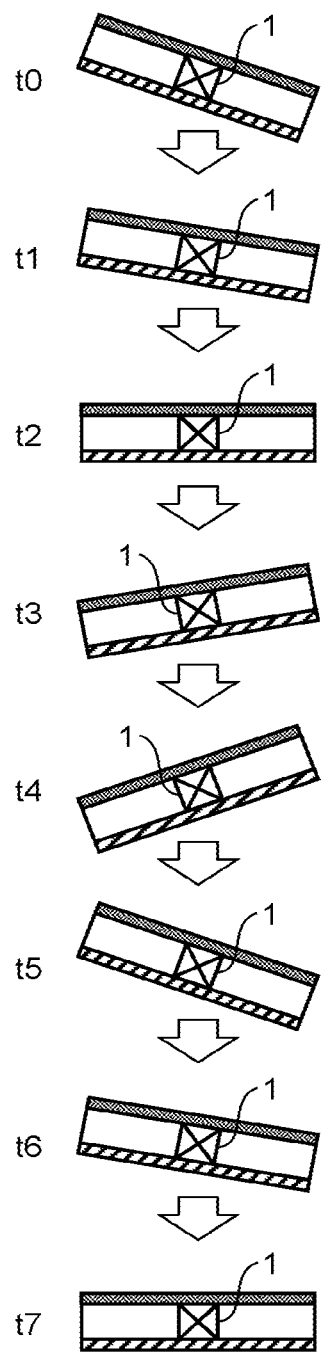
FIG. 8 is a schematic diagram depicting movements of the piezoelectric actuator in response to the drive voltage represented in FIG. 7.

FIG. 7 is a diagram explaining the operation of the piezoelectric actuator 10 in the Y-axis direction. FIG. 8 is a diagram of the piezoelectric actuator 10 viewed from the bottom. In FIG. 7, a solid line indicates a voltage waveform of voltage between the electrodes SDA and SDAG, and a dashed line indicates a voltage waveform of voltage between the electrodes SDB and SDBG. These waveforms are 180-degree phase-reversal saw-tooth waves. At time t0, the voltage between the electrodes SDA and SDAG reaches a maximum, and the voltage between the electrodes SDB and SDBG is zero. The mirror 1 at this time (the time t0), as illustrated in FIG. 8, tilts to the tight at the maximum around the mirror 1. At time t1, the voltage between the electrodes SDA and SDAG becomes approximately one-quarter of the maximum voltage, and the voltage between the electrodes SDB and SDBG becomes approximately three-quarters of the maximum voltage, and the tilt of the mirror 1 becomes roughly intermediate between the maximum tilt and horizontal. At time t2, the voltage between the electrodes SDA and SDAG and the voltage between the electrodes SDB and SDBG both become approximately one-half of the maximum voltage, and the tilt of the mirror 1 becomes nearly horizontal. At time t3, the voltage between the electrodes SDA and SDAG becomes approximately three-quarters of the maximum voltage, and the voltage between the electrodes SDB and SDBG becomes approximately one-quarter of the maximum voltage, and the tilt of the mirror 1 becomes roughly intermediate between the maximum tilt in a direction opposite to the maximum tilt at the time t0 and horizontal. At time t4, the voltage between the electrodes SDA and SDAG becomes zero, and the voltage between the electrodes SDB and SDBG reaches a maximum, and the tilt of the mirror 1 becomes the maximum tilt in a direction opposite to the maximum tilt at the time t0. At time t5, the voltage between the electrodes SDA and SDAG reaches a maximum, and the voltage between the electrodes SDB and SDBG becomes zero, and the mirror 1 tilts to the right at the maximum just like at the time t0.

Figure 9:
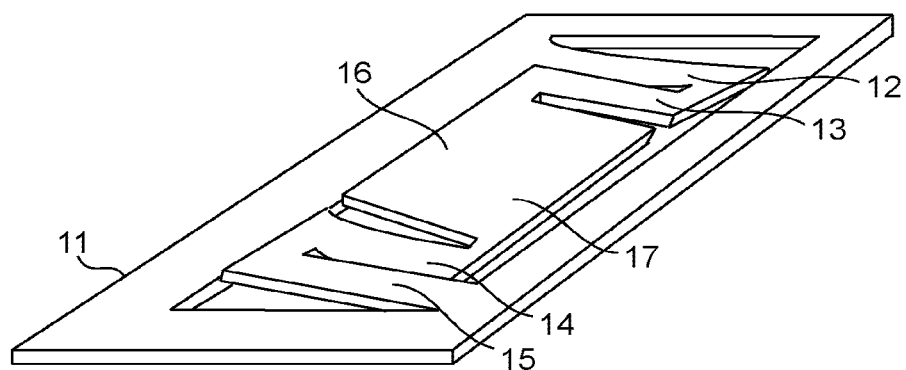
FIG. 9 is a diagram (the first part) explaining the shape of the piezoelectric actuator when the piezoelectric actuator moves in the Y-axis side.
Figure 10:
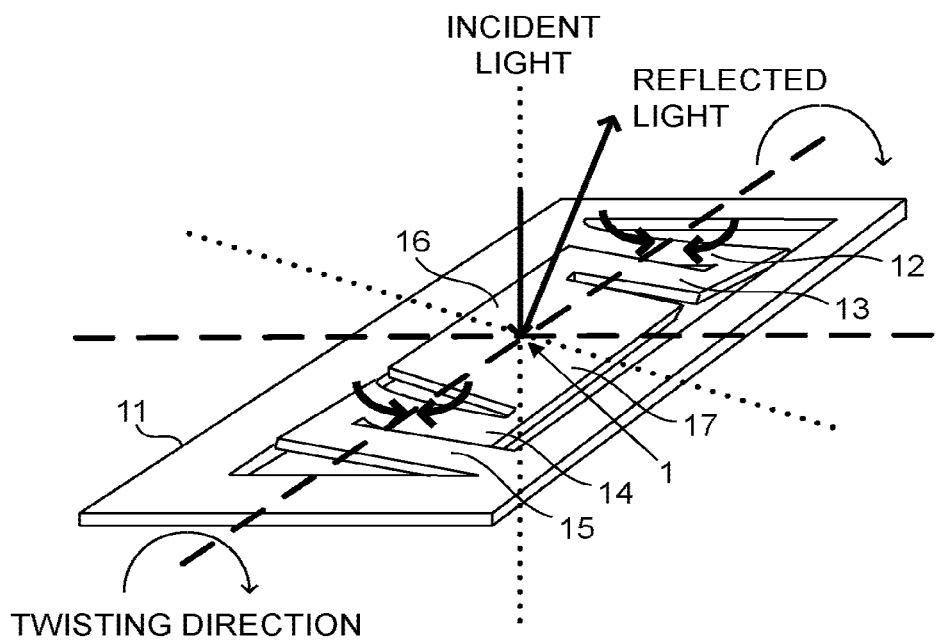
FIG. 10 is a diagram illustrating the relations between a scanning direction, a scanning area, and an image formation region and the emission line of light in the shape illustrated in FIG. 9.
Figure 11:
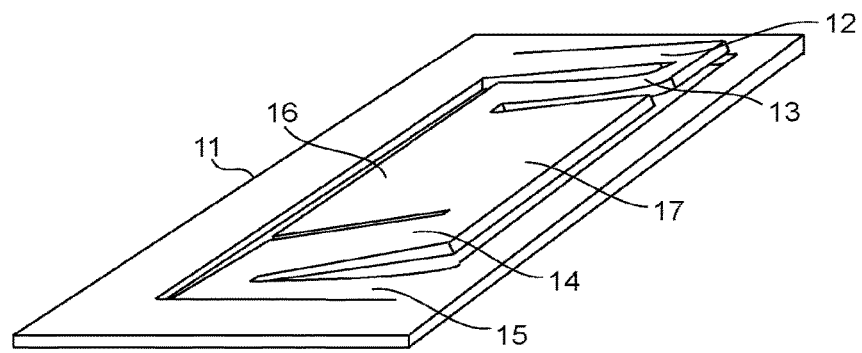
FIG. 11 is a diagram (the second part) explaining the shape of the piezoelectric actuator when the piezoelectric actuator moves in the Y-axis side.
Figure 12:
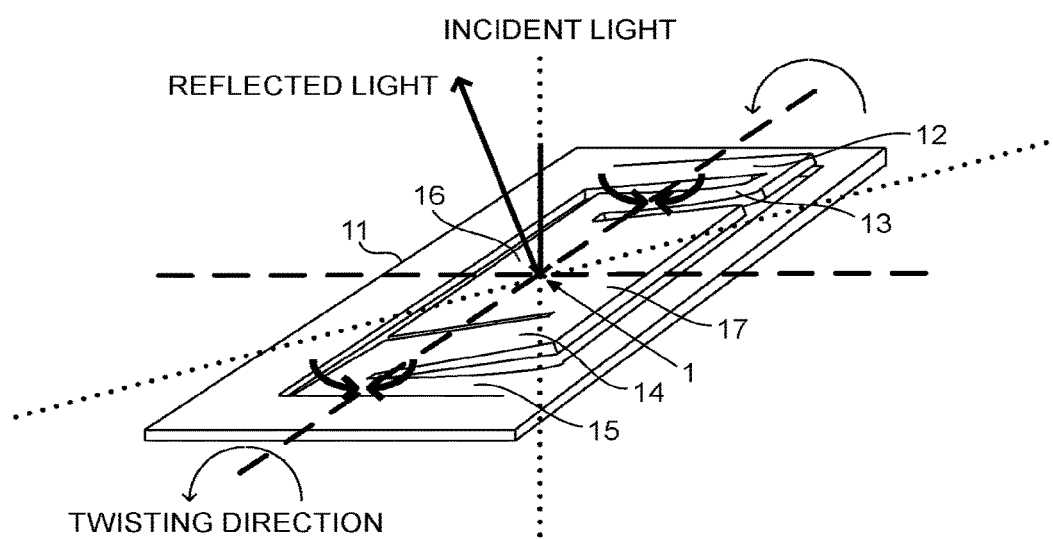
FIG. 12 is a diagram illustrating the relations between a scanning direction, a scanning area, and an image formation region and the emission line of light in the shape illustrated in FIG. 11.

FIGS. 9 to 12 are diagrams explaining the operation of the piezoelectric actuator 10 in the Y-axis direction, and are diagrams of the operation in FIG. 8 when viewed sterically. FIG. 9 is a diagram illustrating the state of the piezoelectric actuator at the times t0 and t5 illustrated in FIG. 8, and illustrates the electrode SDA, i.e., the case where the piezoelectric elements 22 and 24 belonging to Ach contract to the maximum. FIG. 11 is a diagram illustrating the state at the time t4 in FIG. 8, and illustrates the electrode SDB, i.e., the case where the piezoelectric elements 23 and 25 belonging to Bch contract to the maximum. FIGS. 10 and 12 are diagrams illustrating detailed explanation for FIGS. 9 and 11, respectively. As can be seen from FIGS. 9 to 12, when a light enters the mirror 1, the reflected light scans in the Y-axis direction (horizontal direction). When such a piezoelectric actuator is applied to a system such as an optical scanner, light is generally scanned in the Y-axis direction in a linear fashion, i.e., the raster scan operation is generally performed. FIGS. 9 to 12 explain the situation in which the piezoelectric actuator is operated by a raster scan. In this operation, a frequency of applied voltage is about tens of hertz. In the case of handling a general image or video, the piezoelectric actuator is often operated at 60 to 70 Hz.

In the above-described operation, while the piezoelectric actuator 10 is operated in the X-axis direction with as low energy as possible by using resonance phenomena, while being operated in the Y-axis direction by dissonance. Therefore, the amount of displacement of piezoelectric elements in the Y-axis direction is small. So, the turn structure parts 12 to 15 and the X-axis frames 16 and 17 are disposed in the piezoelectric actuator 10, and the multiple piezoelectric elements 22 to 27 are operated in parallel, thereby earning the amount of displacement in the Y-axis direction.

Figure 13:
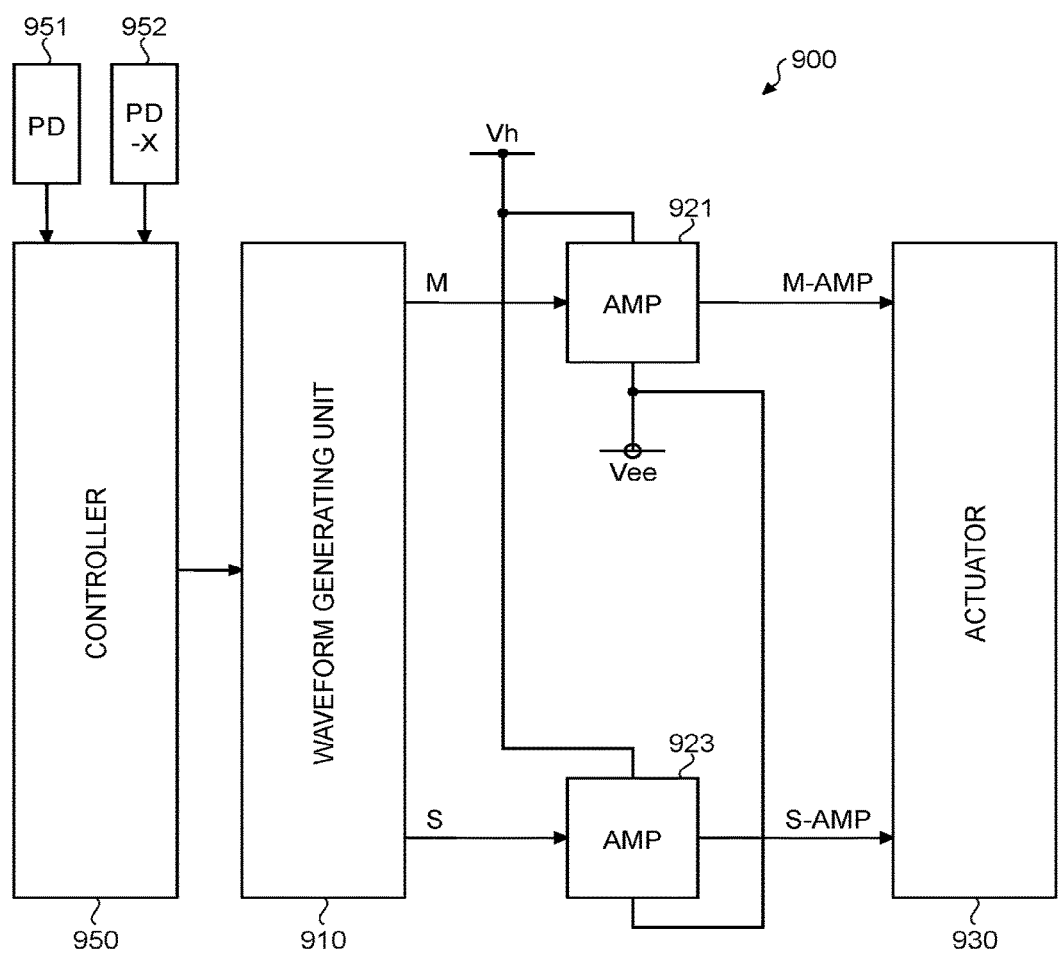
FIG. 13 is a schematic diagram illustrating an example of a schematic configuration of an actuator driving device given as a comparative example.

FIG. 13 illustrates an example of a schematic configuration of an actuator driving device as a comparative example. As illustrated in FIG. 13, an actuator driving device 900 includes a waveform generating unit 910, amplifiers 921 and 923, an actuator 930, a controller 950, a photo diode (PD) 951, and a photo diode (PD-X) 952. The waveform generating unit 910 outputs main-scanning drive voltage M to the amplifier 921 and outputs sub-scanning drive voltage S to the amplifier 923. As power supplies to each of the amplifiers 921 and 923, a negative power supply Vee and a positive power supply Vh of voltage higher than peak-power voltage so that voltage of 0V to the peak-power voltage can be applied. In addition, output M-AMP (main scanning) of the amplifier 921 and output S-AMP (sub scanning) of the amplifier 923 are connected to a drive unit of the actuator 930.

Figure 14:
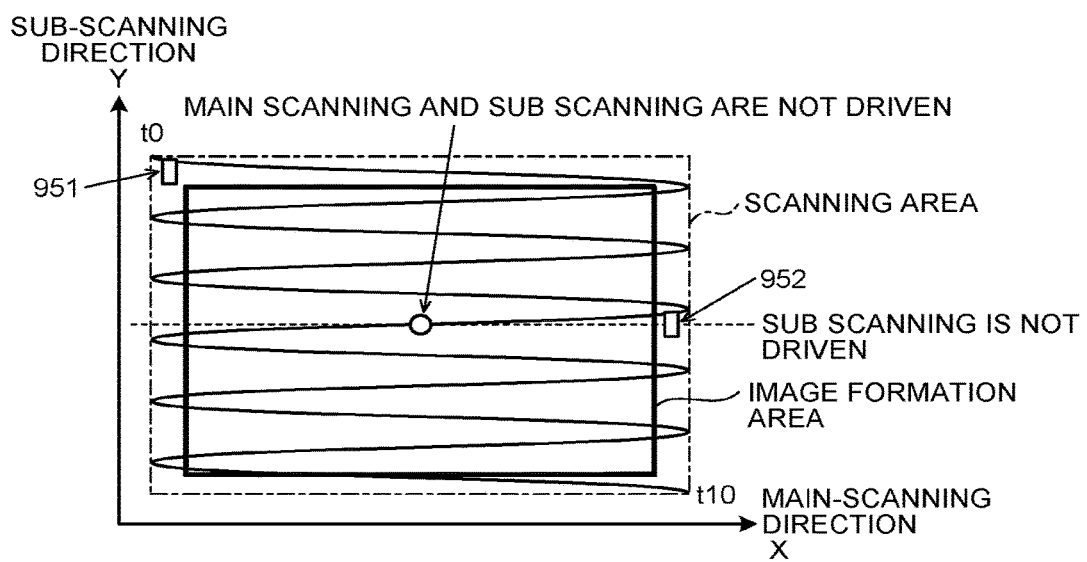
FIG. 14 is a diagram illustrating movements for forming a two-dimensional image by using a piezoelectric actuator.

Here, as illustrated in FIG. 14, when a two-dimensional image is formed by driving main scanning and sub scanning in a steady state, a scanning area starts from the upper left corner at a clock time t0 and the scanning area for one screen ends at the lower right end. The photo diodes 951 and 952 that detect laser beams are arranged outside the image formation region. The amplitudes of main scanning and sub scanning are controlled by the photo diode 952 provided at a position that laser light used for scanning enters when only main scanning is being driven without sub scanning being driven, and by the photo diode 951 provided at a position that laser light used for scanning enters when main scanning and sub scanning are both being driven. When the amplitude of main scanning is controlled by the photo diode 952, it is possible to use times for when the light enters this diode in shorter cycles outside the image formation region and when the light enters this diode in cycles in each of which the light enters and comes back out of the image formation region. For example, in the case of the shorter cycles, when these cycles are set as small as possible, image formation outside the image formation region can be minimized as for as possible, and efficient image formation is enabled. However, such control results in a small margin and therefore has a disadvantage of being susceptible to disturbance. In contrast, when these cycles are longer, the control makes the efficiency lower but has an advantage of being robust to disturbance. Sub scanning can be controlled by use of the photo diode 951 in the same manner as main scanning.

Figure 15:
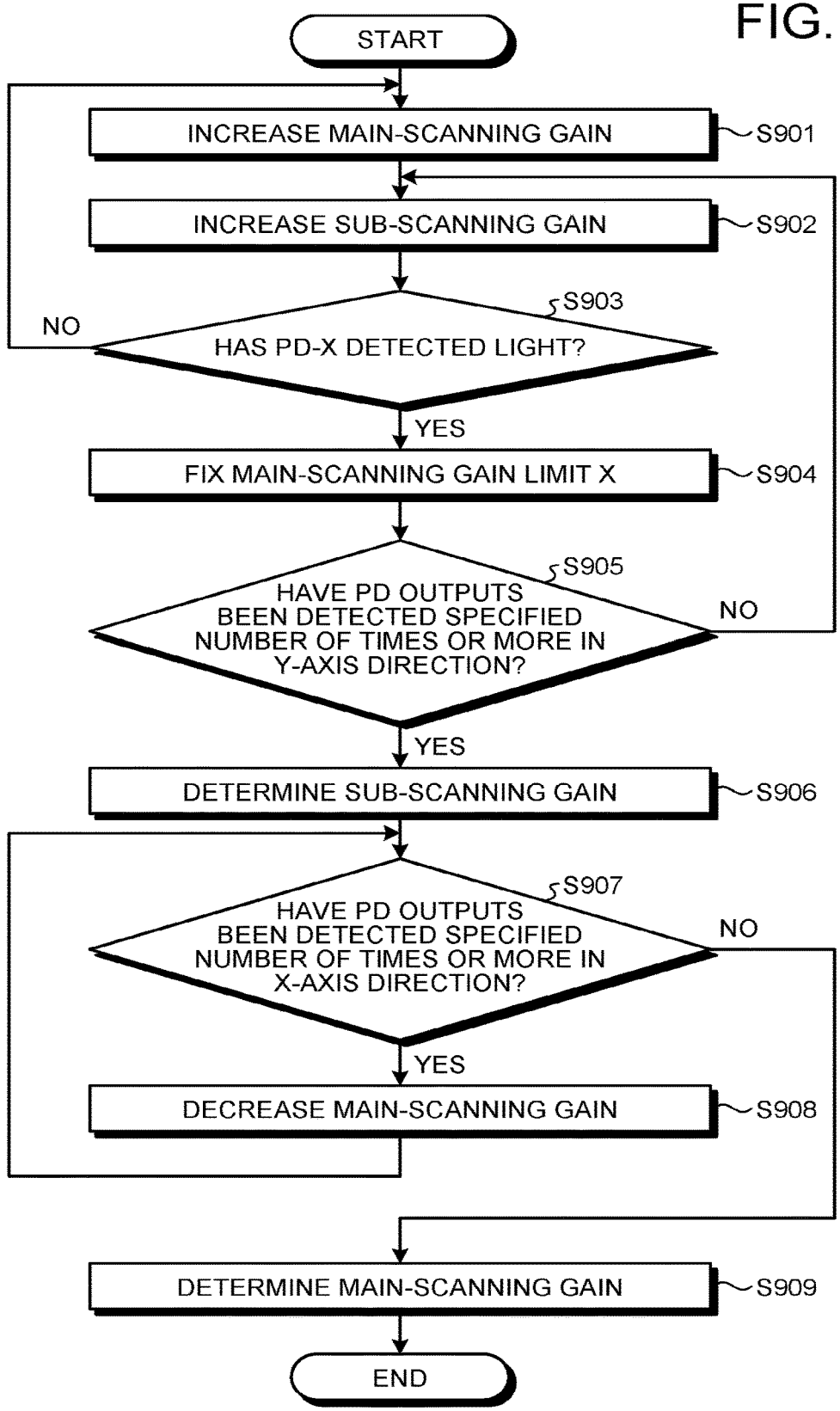
FIG. 15 is a flowchart illustrating an example of operation that a controller in the comparative example performs.
Figure 16:
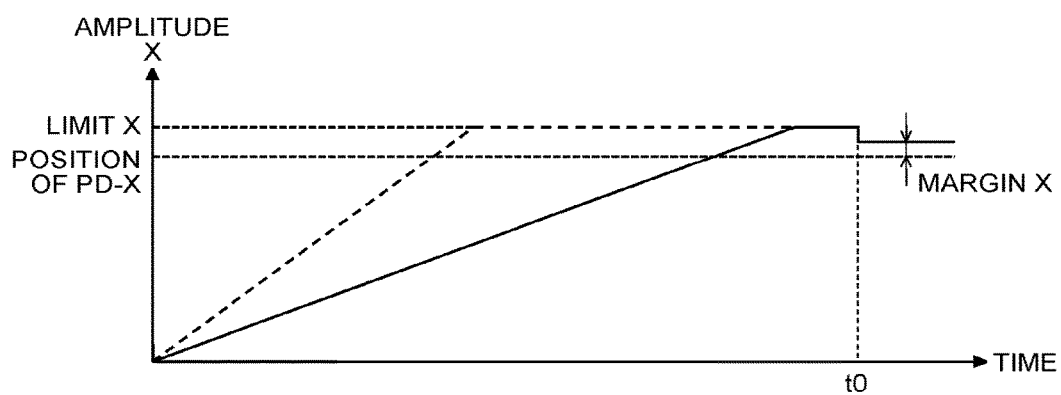
FIG. 16 is a graph representing an example of change in amplitude of main scanning until main scanning reaches a steady state during the operation illustrated in FIG. 15.
Figure 17:
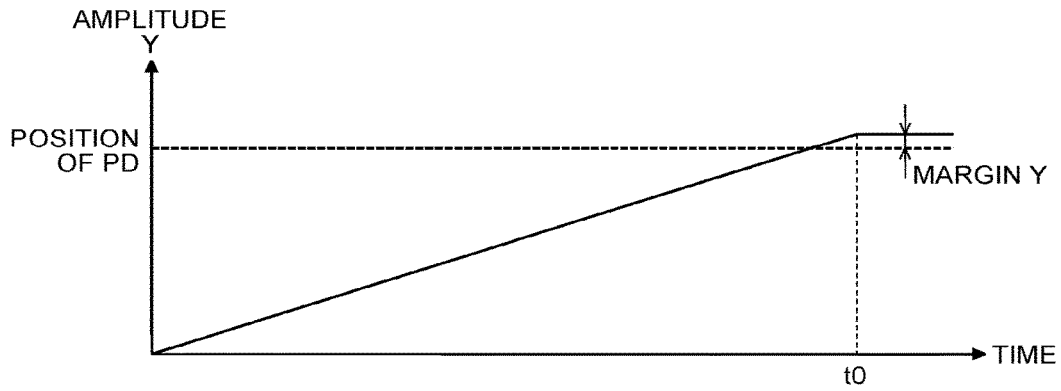
FIG. 17 is a graph representing an example of change in amplitude of sub scanning until sub scanning reaches a steady state during the operation illustrated in FIG. 15.

Here, a procedure to be taken until main scanning and sub scanning reach steady states during movements for forming a two-dimensional image is described with reference to the drawings. FIG. 15 is a flowchart illustrating an example of operation that the controller performs until main scanning and sub scanning reach steady states. FIG. 16 is a graph representing an example of change in amplitude of main scanning until main scanning reaches a steady state. FIG. 17 is a graph representing an example of change in amplitude of sub scanning until sub scanning reaches a steady state.

As illustrated in FIG. 15 to FIG. 17, when formation of a two-dimensional image is started, light having entered the photo diode 952 is detected (Step S903) while the main-scanning gain is gradually increased with the sub-scanning gain gradually decreased (Steps S901 and S902). During these steps, although the amplitude of sub scanning gradually increases, the controller 950 performs control so that main scanning can reach its limit than sub scanning. Thereafter, when the amplitude is larger than the position of the photo diode 952 (hereinafter referred to as the PD-X position) and has reached a limit X, the main-scanning gain is maintained so that the amplitude can be fixed for the time being (Step S904). The sub-scanning gain continues to be increased until the number of times the photo diode 951 has detected light having entered the photo diode 951 in the Y-axis direction has become at least a specified number of times, which is a predetermined value, that is, until sub scanning reaches an amplitude including a margin Y (NO at Step S905). Thereafter, when sub scanning has reached the amplitude including the margin Y (YES at Step S905), the sub-scanning gain is determined and the amplitude is thus fixed (Step S906).

With regard to the amplitude of main scanning, if the number of times the photo diode 951 has detected light having entered the photo diode 951 in the X-axis direction is not at least the specified number of times previously specified (NO at Step S907), the gain is determined to be as it is and the amplitude is thus fixed (Step S909). The operation is then ended. On the other hand, if the number of times light having entered the photo diode 951 in the X-axis direction has been detected is at least the specified number of times (YES at Step S907), the amplitude is decreased to a value including the margin X from the limit when the amplitude of sub scanning is determined (Step S908), and the operation returns to Step S907. The operation as described above causes main scanning and sub scanning to reach steady states as illustrated in FIG. 16 and FIG. 17.

Figure 18:
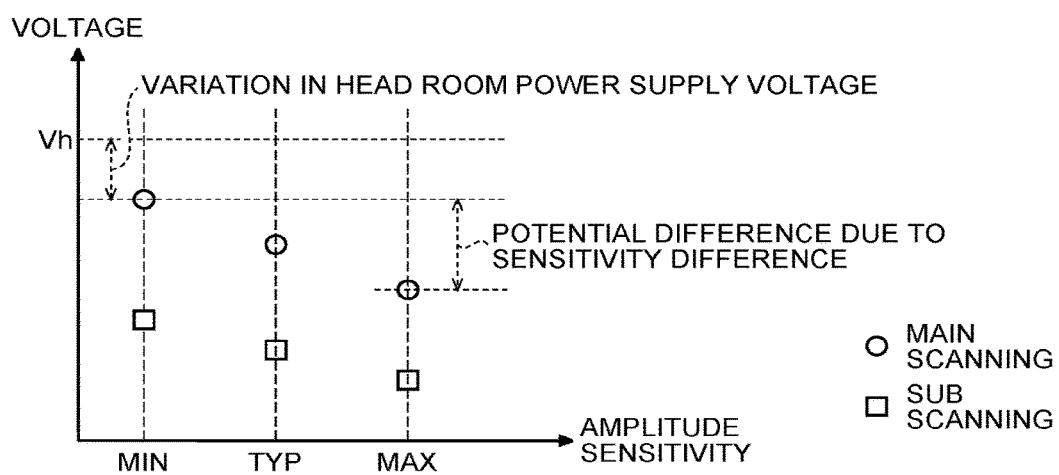
FIG. 18 is a diagram illustrating an example of variation in driving sensitivity among piezoelectric actuators.

FIG. 18 illustrates an example of variation in driving sensitivity among piezoelectric actuators. In FIG. 18, the vertical axis indicates voltage needed for driving, and the horizontal axis indicates the amplitude sensitivity of piezoelectric actuators. As illustrated in FIG. 18, for the actuator that needs the maximum voltage for driving, the power supply voltage Vh is voltage obtained by adding a power supply voltage variation to a head room (a voltage region that cannot be output) of a circuit. The actuator having the least driving sensitivity for sub scanning needs the maximum voltage for driving. In the case of sub scanning, raster scanning is performed, and high voltage is naturally needed. In contrast, main scanning is driven by resonance as described above and can be performed at lower drive voltage than sub scanning, in general.

Figure 19:
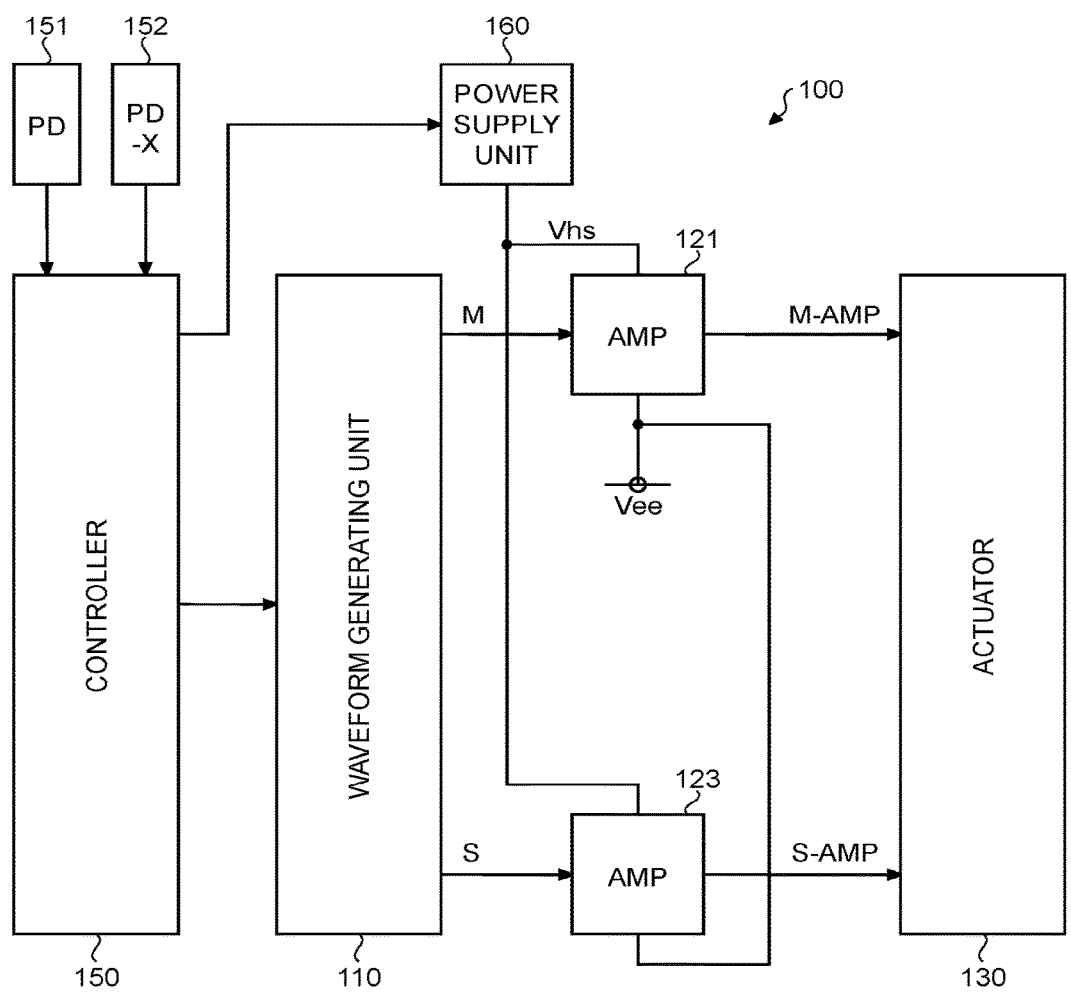
FIG. 19 is a schematic diagram illustrating an example of a schematic configuration of a drive system according to a first embodiment of the present invention.

Next, a drive system and a drive controlling method according to a first embodiment are described in detail with reference to the drawings. FIG. 19 is a schematic diagram illustrating an example of a schematic configuration of the drive system according to the first embodiment. As illustrated in FIG. 19, the drive system 100 includes an actuator 130, a main-scanning driving amplifier 121, a sub-scanning driving amplifier 123, a waveform generating unit 110, a controller 150, a photo diode (PD) 151, a photo diode (PD-X) 152, and a power supply unit 160. The actuator 130, the main-scanning driving amplifier 121, the sub-scanning driving amplifier 123, the waveform generating unit 110, the photo diode (PD) 151 and the photo diode (PD-X) 152 may be the same as those in the drive system 900 illustrated in FIG. 13. However, the drive system 100 according to the first embodiment is configured so that the main-scanning driving amplifier 121 and the sub-scanning driving amplifier 123 can be driven with voltage Vhs supplied by the power supply unit 160.

Figure 20:
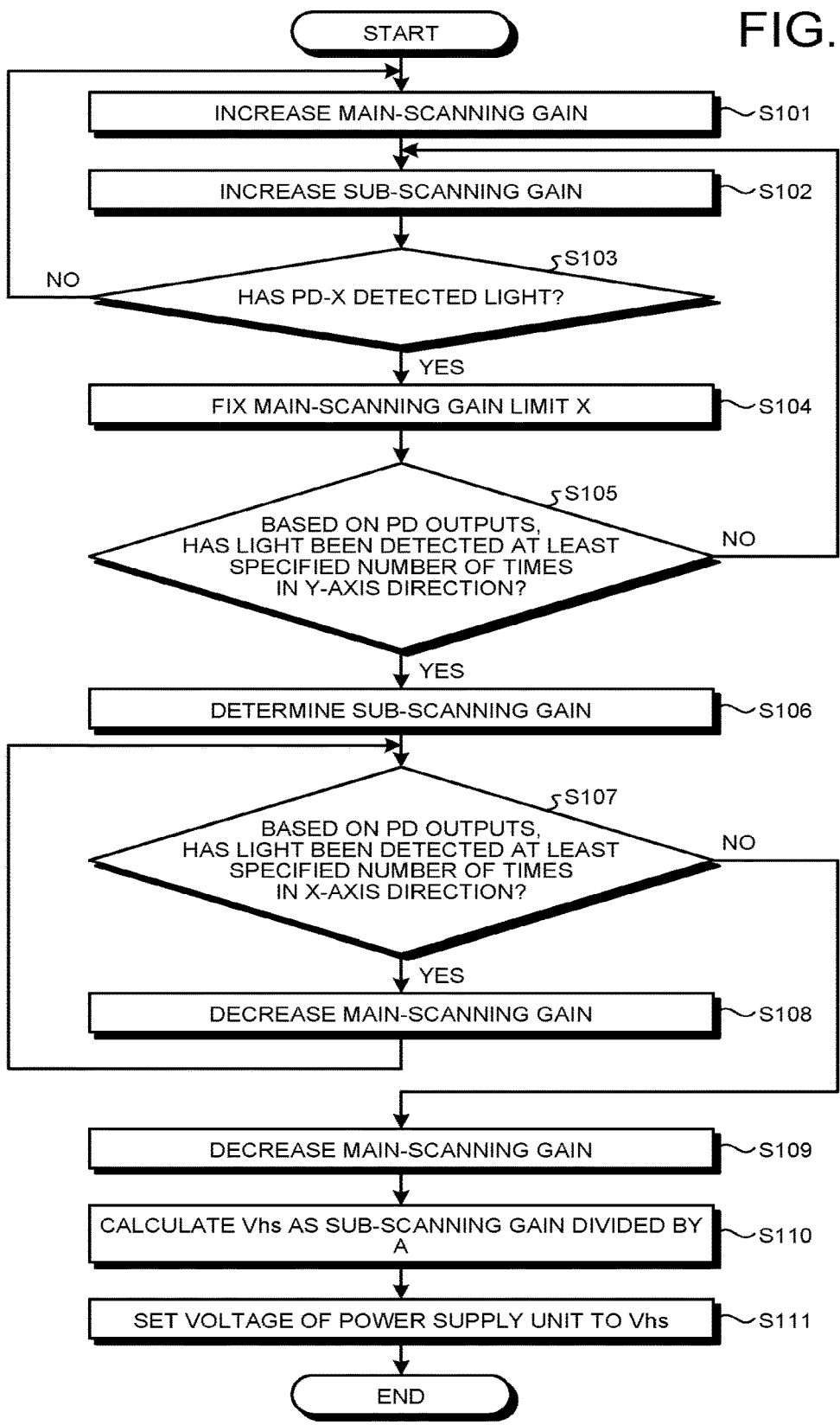
FIG. 20 is a flowchart illustrating an example of operation that a controller in the first embodiment of the present invention performs.

FIG. 20 is a flowchart illustrating an example of operation that the controller performs until main scanning and sub scanning reach steady states during the movements for forming a two-dimensional image by using the drive system illustrated in FIG. 19. As illustrated in FIG. 20, in the first embodiment, the controller 150 determines the gain of main scanning and fixes the amplitude thereof by executing a part (Steps S101 to S109) of the operation that is same as the operation (Steps S901 to S909) explained with reference to FIG. 15 to FIG. 17. Subsequently, the controller 150 finds the voltage Vhs by dividing the sub-scanning gain by a parameter A (Step S110), and then sets the voltage of the power supply unit 160 to the voltage Vhs (Step S111).

Here, to facilitate understanding of the flowchart illustrated in FIG. 20, the flowchart is explained with specific numerical examples. It is assumed that the power supply voltage Vh is constant. It is also assumed that the necessary deflection angle for sub scanning is 10 degrees and that the typical value (TYP), the minimum value (MIN), and the maximum value (MAX) of the driving sensitivity for sub scanning is 0.375 degrees/V, 0.25 degrees/V, and 0.5 degrees/V, respectively. In that case, the voltage is 40 V (=10 degrees/(0.25 degrees/V)), and the power supply voltage Vh is 48 V with the assumption that a margin and a head room account for 20% in total.

Subsequently, with the assumption that the limit (maximum setting value) of the deflection angle of a drive circuit 1000 and that the margin is 100, the limit of the deflection angle is 900 because the setting values are adjusted in agreement with when the driving sensitivity is MIN. Subsequently, when the driving sensitivity is the typical value (TYP), data for when light enters the photo diode 952 is approximately 675 as a result of gradually increasing the deflection angle for main scanning. That is, a desired deflection angle can be obtained with the power supply voltage of 675/900 to the one that is obtained with the driving sensitivity being MIN. Therefore, in this case, 900 and 675 are plugged in for the parameter A and the sub-scanning gain at Step S110 in FIG. 20, respectively. As a result, the voltage Vhs is calculated to be 36 V. This value of the voltage Vhs reflects the margin and the head room, and is 12 V lower than the value (48 V) of the power supply voltage. Finally, when the driving sensitivity is MAX, the data is approximately 450, and the similar calculation is performed, whereby the value of the voltage Vhs is found to be 24 V, which is half that of the power supply voltage.

As described above, in the first embodiment, the voltage Vhs is set by having the actuator 130 actually driven, so that the power supply voltage Vh does not need to be uselessly large. Consequently, power consumption can be reduced. In addition, even in the case where variation in driving sensitivity among the actuators 130 is large, the voltage Vhs can be optimally set for the individual actuators 130, whereby an acceptable range for variation in sensitivity among the actuators 130 can be set wide. Consequently, the yield of the actuators 130 can be increased. The other parts of the configuration and the operation are the same as those in the comparative example described above, and detailed description thereof is omitted herein.

Figure 21:
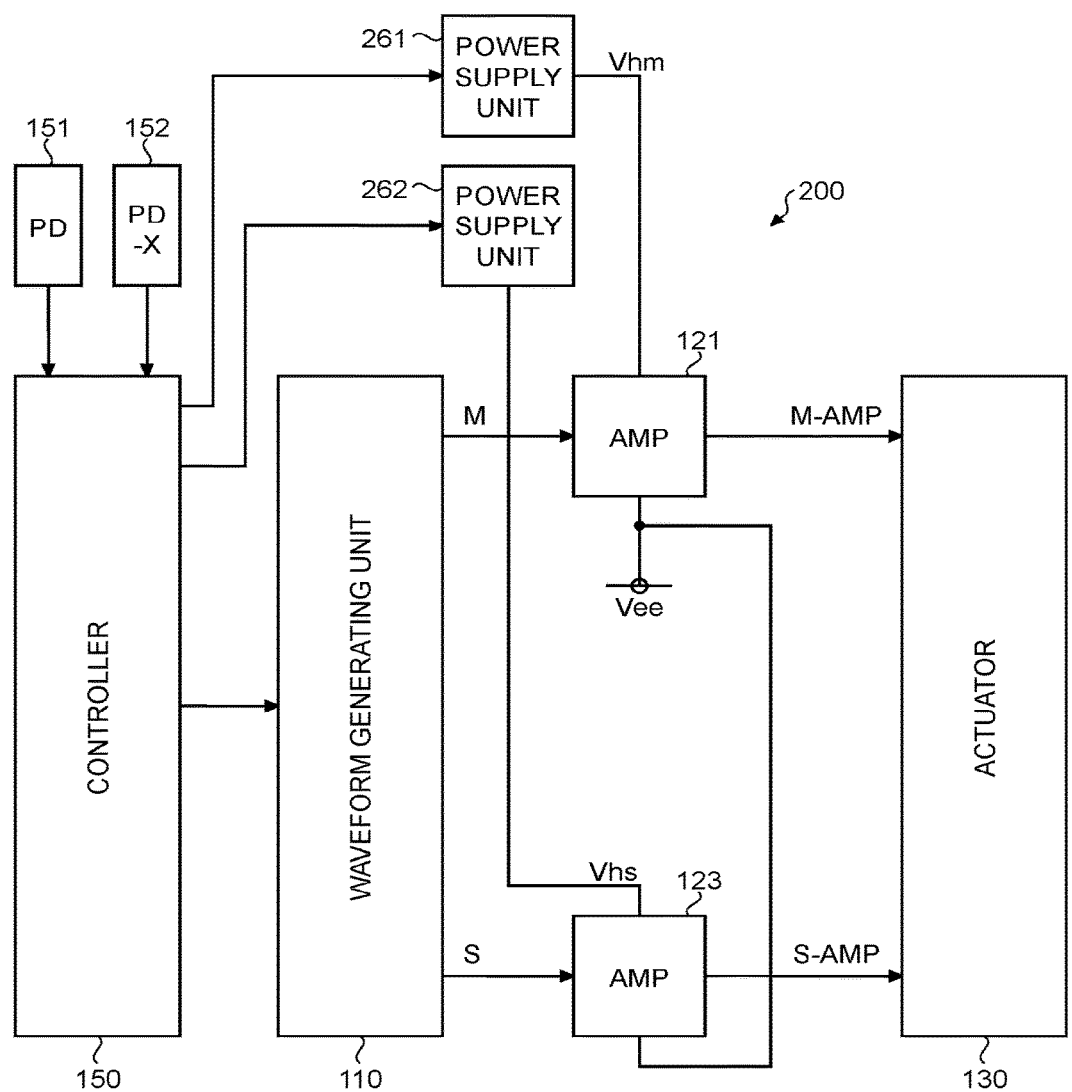
FIG. 21 is a schematic diagram illustrating an example of a schematic configuration of a drive system according to a second embodiment of the present invention.

Next, a drive system and a drive controlling method according to a second embodiment are described in detail with reference to the drawings. FIG. 21 is a schematic diagram illustrating an example of a schematic configuration of the drive system according to the second embodiment. As illustrated in FIG. 21, the drive system 200 includes two power supply units 261 and 262, in place of the power supply unit 160, in the same configuration as the one in the drive system 100 according to the first embodiment. The power supply unit 261 is a power supply for driving main scanning and supplies voltage Vhm to the main-scanning driving amplifier 121 under the control of the controller 150. The power supply unit 262 is a power supply for driving sub scanning and supplies voltage Vhs to the sub-scanning driving amplifier 123 under the control of the controller 150.

Figure 22:
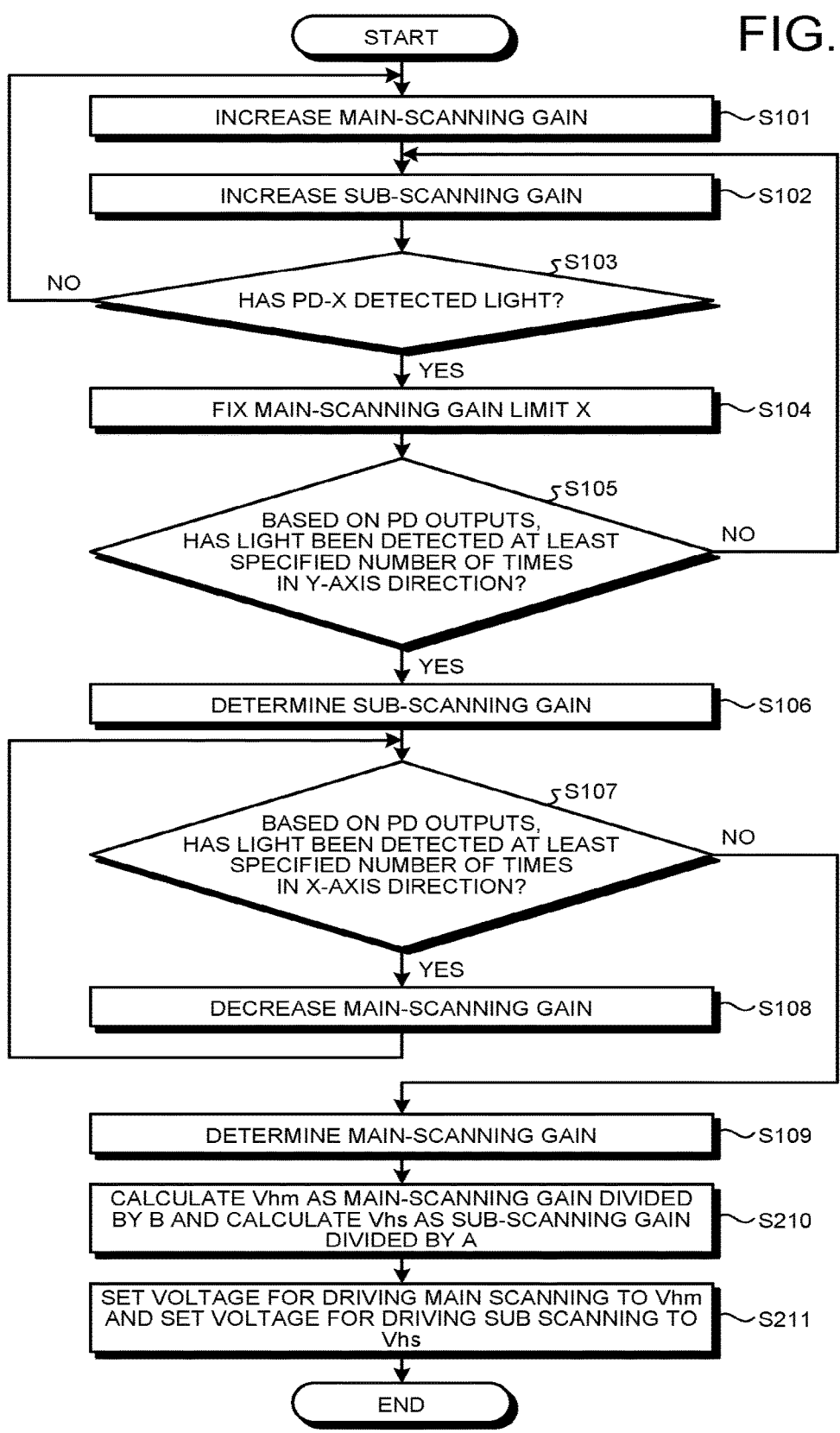
FIG. 22 is a flowchart illustrating an example of operation that a controller in the second embodiment of the present invention performs.

FIG. 22 is a flowchart illustrating an example of operation that the controller performs until main scanning and sub scanning reach steady states during the movements for forming a two-dimensional image by using the drive system illustrated in FIG. 21. As illustrated in FIG. 22, in the second embodiment, the controller 150 determines the gain of main scanning and fixes the amplitude thereof by executing a part of the operation that is the same as Steps S101 to S109 in FIG. 20. Subsequently, the controller 150 finds the voltage Vhm by dividing the main-scanning gain by a parameter B and finds the voltage Vhs by dividing the sub-scanning gain by a parameter A (Step S210). The voltage Vhm and the voltage Vhs may be calculated in the same manner as the calculation manner explained for Step S110 in the first embodiment. Subsequently, the controller 150 sets the voltage of the power supply unit 261 for driving main scanning to the voltage Vhm, and sets the voltage of the power supply unit 262 for driving sub scanning to the voltage Vhs (Step S211).

As described above, in the second embodiment, the voltage Vhm for driving main scanning and the voltage Vhs for driving sub scanning are set individually, the voltage Vhm for driving main scanning can be decreased independently, whereby power consumption can be further reduced. In addition, it becomes possible to use commonly used components as circuit components for driving main scanning, unlike circuit component for driving sub scanning that relatively need to withstand high voltage, and to thereby reduce the costs of the circuit components. The other parts of the configuration and the operation are the same as those in the embodiment described above, and detailed description thereof is omitted herein.

Next, a third embodiment is described. The drive system and the drive controlling method illustrated in each of the above embodiments can be employed in video device. Consequently, video device having a low-power consumption and high-performance optical scanner therein can be provided.

Next, a fourth embodiment is described. Each of the drive systems given as examples in the first and the second embodiments described above is capable of functioning as an light deflector. Therefore, each of these drive systems can be used in an image projection device such as a projector, a head-mounted display, or a head-up display or in a mobile-body apparatus that has an image projection device therein. An image projection device having any one of the drive systems given as examples in the first and the second embodiments described above is described in detail as the fourth embodiment with reference to the drawings.

Figure 23:
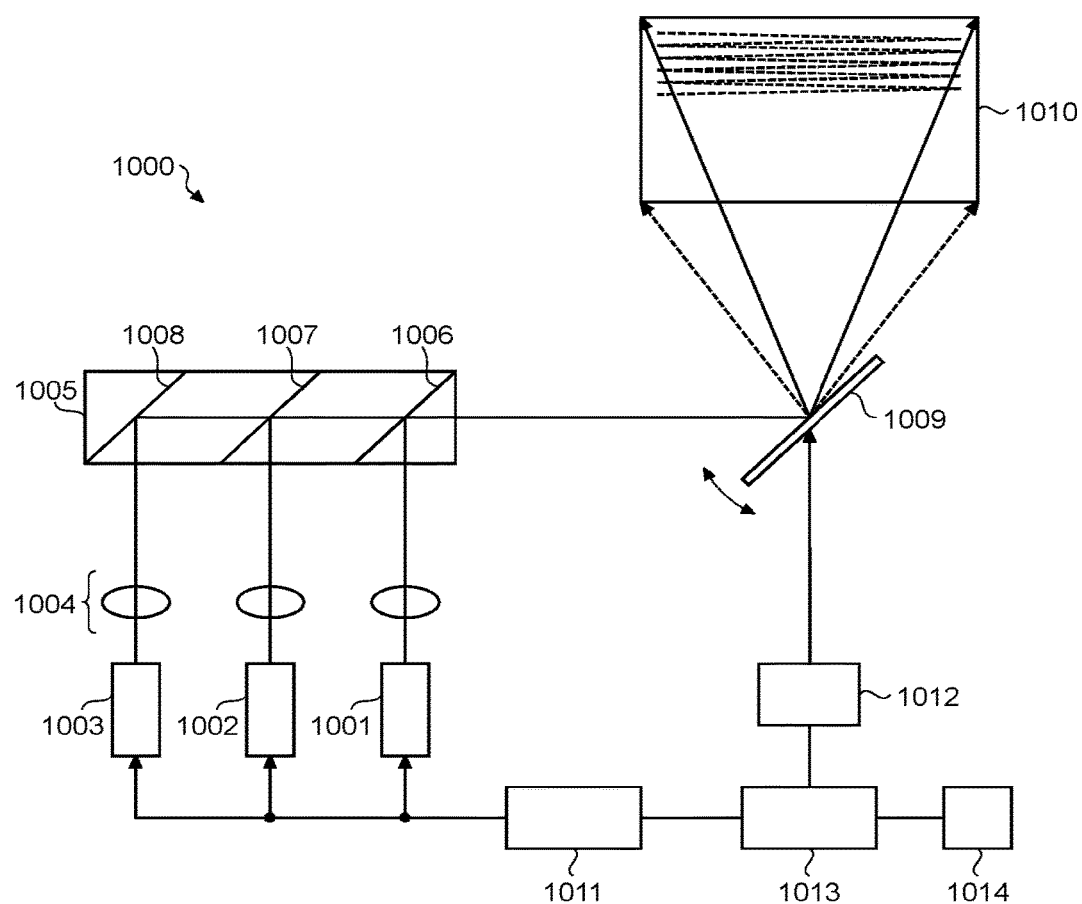
FIG. 23 is a schematic diagram illustrating an example of a schematic configuration of an image projection device according to a fourth embodiment of the present invention.

FIG. 23 is a schematic diagram illustrating an example of a schematic configuration of the image projection device according to the fourth embodiment. As illustrated in FIG. 23, an image projection device 1000 includes a red laser light source 1001, a green laser light source 1002, a blue laser light source 1003, collimator lenses 1004, an optical-paths synthesizing unit 1005, a two-dimensional light deflector 1009, an LD drive unit 1011, an light-deflector drive unit 1012, a controller 1013, and a storage unit 1014. The drive system according to any one of the first or the second embodiment is embedded in the light-deflector drive unit 1012. However, the photo diodes 151 and 152 in the drive system can be replaced with any other appropriate components that are placed at positions to be entered by a scanned laser beam such as those in the two-dimensional light deflector 1009.

The collimator lenses 1004 and the optical-paths synthesizing unit 1005 constitute an optical system that makes laser beams output from the laser light sources 1001 to 1003 to be incident on a reflection mirror 1100 (refer to FIG. 24) in the two-dimensional light deflector 1009. Light beams individually emitted from the red laser light source 1001, the green laser light source 1002, and the blue laser light source 1003 are converted into collimated beams by the collimator lenses 1004 and exit therefrom. In the example illustrated in FIG. 23, light sources that emit light having a wavelength of 642 nm, light having a wavelength of 520 nm, and light having a wavelength of 450 nm are used as the red laser light source 1001, the green laser light source 1002, and the blue laser light source 1003, respectively.

After being collimated by the collimator lenses 1004, the laser beams enter the optical-paths synthesizing unit 1005. The optical-paths synthesizing unit 1005 synthesizes three optical paths into one optical path, and includes optical path synthesizing prisms such as dichroic mirrors. This optical-paths synthesizing unit 1005 may have reflecting surfaces the number of which corresponds to the number of light sources. Therefore, in the example illustrated in FIG. 23, the optical-paths synthesizing unit 1005 includes three reflecting surfaces 1006, 1007, and 1008.

On the reflecting surface 1006, a dichroic film that reflects a laser beam having a wavelength for red and transmits laser beams having wavelengths for green and blue is formed. On the reflecting surface 1007, a dichroic film that reflects a laser beam having a wavelength for green and transmits a laser beam having a wavelength for blue is formed. The reflecting surface 1008 reflects a laser beam having a wavelength for blue. The optical-paths synthesizing unit 1005 synthesizes three optical paths into one optical path by having the reflecting surfaces 1006 to 1008 as described above.

A dichroic film that reflects a laser light of red wavelength and lets laser lights of green and blue wavelengths therethrough is formed on the reflecting surface 1006. A dichroic film that reflects a laser light of green wavelength and lets a laser light of blue wavelength therethrough is formed on the reflecting surface 1007. The reflecting surface 1008 reflects a laser light of blue wavelength. With these reflecting surfaces 1006 to 1008, the optical-paths synthesizing unit 1005 synthesizes three optical paths into one optical path.

Figure 24:
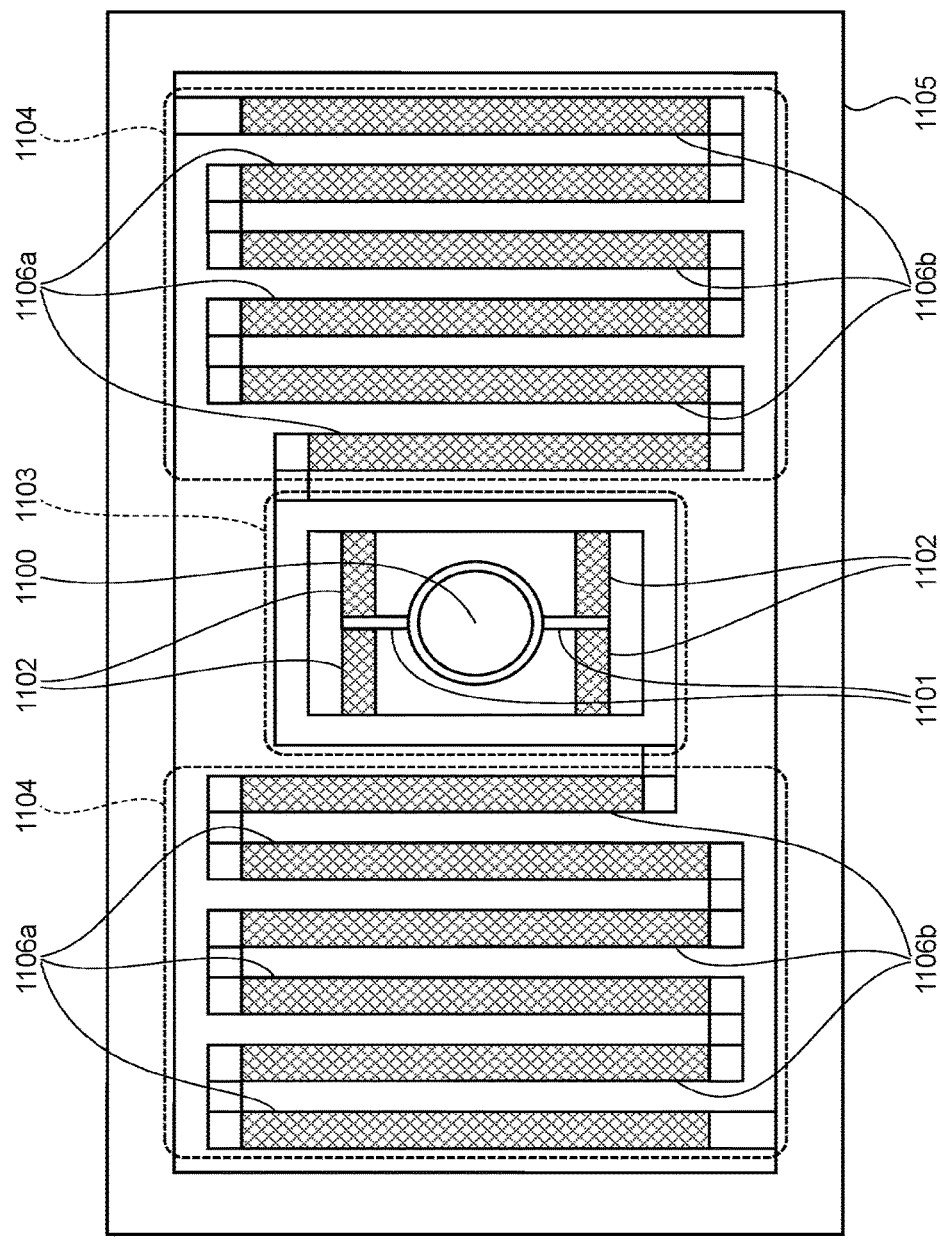
FIG. 24 is a schematic diagram illustrating an example of a schematic configuration of a two-dimensional light deflector in the fourth embodiment of the present invention.

Next, a more specific example of the configuration of the two-dimensional light deflector 1009 in the fourth embodiment is described below in detail with reference to the drawings. FIG. 24 is a schematic diagram illustrating an example of a schematic configuration of the two-dimensional light deflector in the fourth embodiment.

As illustrated in FIG. 24, the two-dimensional light deflector 1009 includes, on the central part thereof, the reflection mirror 1100 that reflects a laser beam. The reflection mirror 1100 is supported by a pair of torsion bars 1101. An end portion of each of the torsion bars 1101 is supported by one end of a corresponding piezoelectric cantilever 1102. The other ends of the piezoelectric cantilevers 1102 are supported by a movable frame 1103. The movable frame 1103 is supported by a pair of joist parts (meandering joist parts) 1104 each formed so as to be meander with a plurality of turning portions. The meandering joist parts 1104 are supported by an element frame member 1105. On each of the individual meandering joist parts, independent piezoelectric elements 1106a and 1106b are provided.

In the configuration illustrated in FIG. 24, when the piezoelectric cantilevers 1102 are driven, the torsion bars 1101 supporting the reflection mirror 1100 are twisted, whereby the reflection mirror 1100 rotates about the Y-axis while vibrating. In this example, the piezoelectric cantilevers 1102 are driven by a sine wave, and the reflection mirror 1100 is rotated by using mechanical resonance.

Figure 25:
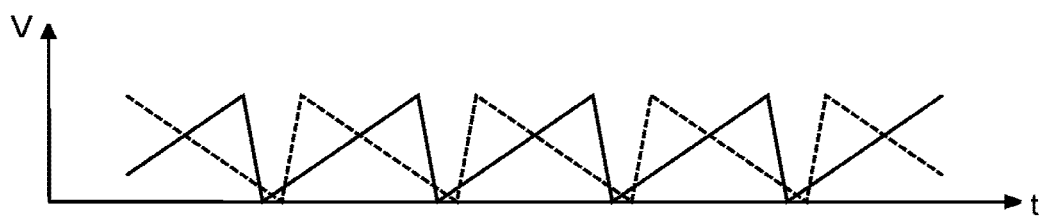
FIG. 25 is a waveform chart representing an example of voltage application patterns in the fourth embodiment of the present invention.

In contrast, when the meandering joist parts 1104 are driven, the movable frame 1103 rotates about the X-axis, and this rotation causes the reflection mirror 1100 to also rotate about the X-axis. Specifically, voltage having saw-tooth waveforms is applied alternately to the piezoelectric elements 1106a and 1106b provided independently on each meandering joist part of the meandering joist parts 1104. This example uses one voltage application pattern with one same waveform applied to all of the piezoelectric elements 1106a, and the other voltage application pattern with another same waveform applied to all of the piezoelectric elements 1106b. An example of the voltage application patterns is illustrated in FIG. 25. In FIG. 25, the vertical axis indicates voltage values, and the horizontal axis indicates time. When the voltage application patterns as illustrated in FIG. 25 are used, the phases of the saw-tooth waveforms are adjusted alternately from one portion to another of each of the meandering joist parts 1104, whereby the meandering joist part 1104 rotates. This manner of driving enables highly uniform optical scanning.

Figure 26:
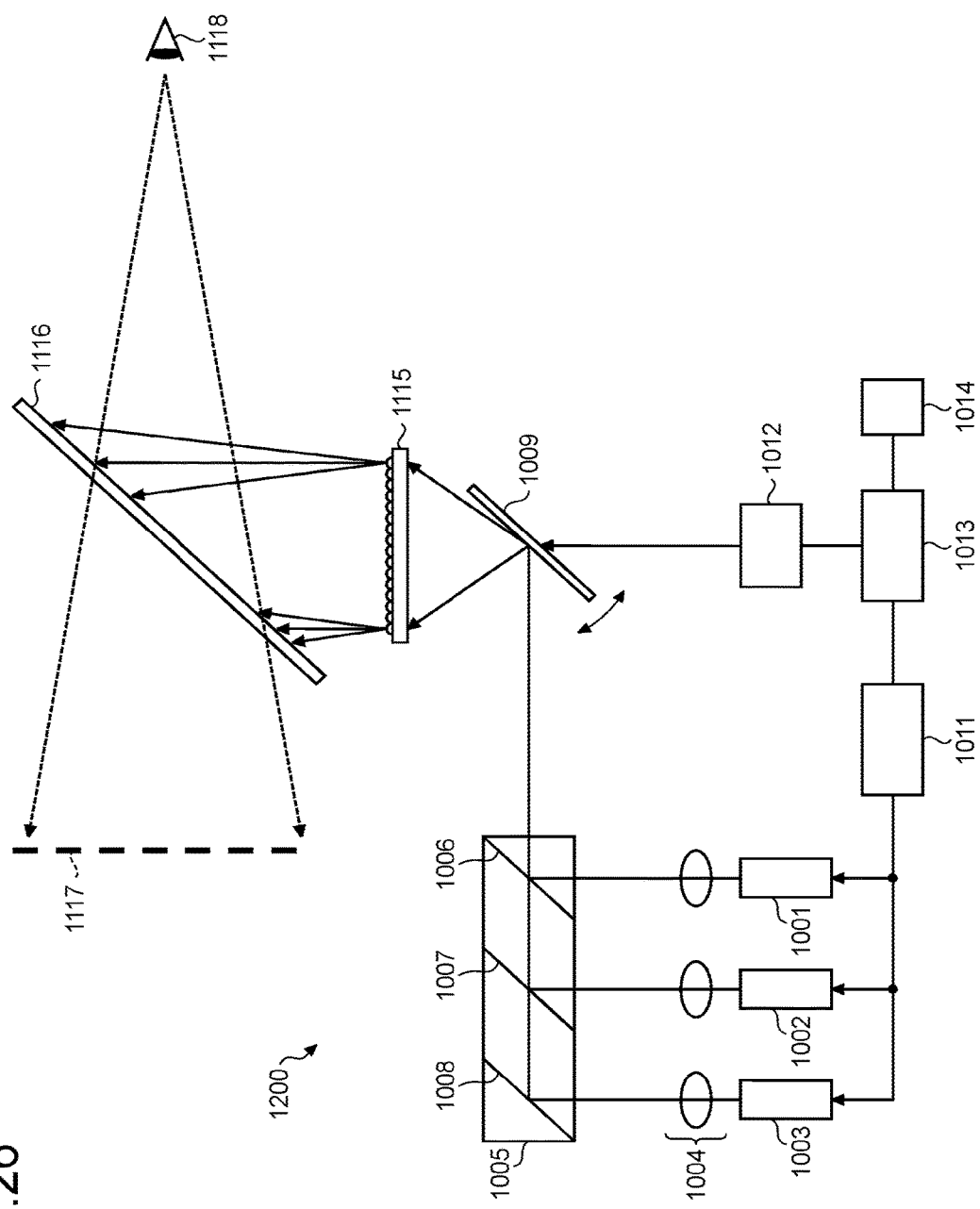
FIG. 26 is a schematic diagram illustrating an example of a schematic configuration of a head-up display according to a modification of the fourth embodiment of the present invention.

Although a projector apparatus is illustrated as an example of the image projection device 1000 in FIG. 23, this is not a limiting example, and the drive system can be applied also to other apparatuses such as: a head-mounted display that is worn around a head; and a head-up display that includes a diffuser panel and a microlens array as a screen and forms a virtual image using a semi-transparent plate such as a front windshield. FIG. 26 illustrates an example of a schematic configuration of a head-up display. As illustrated in FIG. 26, a head-up display 1200 has the same configuration as the image projection device 1000 illustrated in FIG. 23, except that the head-up display 1200 includes a microlens array 1115 and a semi-transparent plate 1116 (for example, a combiner or a front windshield) in the optical path downstream of the two-dimensional light deflector 1009, the microlens array 1115 including a plurality of microlenses. In the configuration illustrated in FIG. 26, an image is formed on the microlens array 1115 in response to movements made by the two-dimensional light deflector 1009 for deflecting a laser beam about a first axis and about a second axis. A virtual image 1117 formed by enlarging the image through the semi-transparent plate 1116 can be viewed from a viewpoint 1118. In this case, the virtual image 1117 has a reduced level of speckle noise because the laser beam is diffused by the microlens array 1115. A windowpane of a vehicle can be used as the semi-transparent plate 1116.

The head-up display 1200 having such a configuration can be incorporated in a movable body, such as a vehicle, an aircraft, an ocean vessel, or a robot. Therefore, it is possible to provide the head-up display 1200 and a movable device including a movable body equipped with the head-up display 1200.

The invention made by the present inventors is described in detail based on the preferred embodiments. Obviously, however, the present invention is not limited to those described in the above embodiments, and various modifications may be made without departing from the scope of the present invention.

The drive systems according to the above-described embodiments can be applied to any device as long as the device is operated by driving an actuator, and can be applied to, for example, an object recognition device that optically scans a laser light emitted from a laser light source in a target direction by driving an actuator having a reflecting surface and recognizes an object existing in the target direction by a reflected light from the target direction. The object recognition device is, for example, a laser radar, a laser three-dimensional measuring device, a biometric authentication device, etc.

Figure 27:
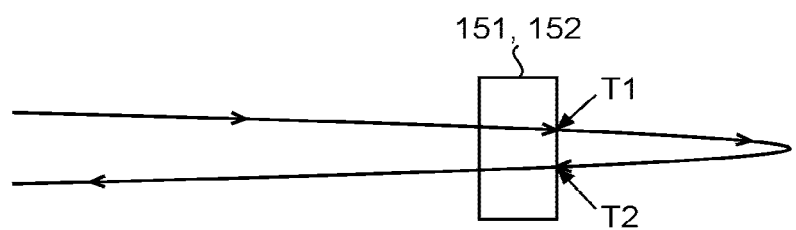
FIG. 27 is a diagram for explaining a case in which laser light enters a photo diode outside an image formation region in short cycles during movements for forming a two-dimensional image by using any one of the piezoelectric actuators according to the first to fourth embodiments of the present invention.
Figure 28:
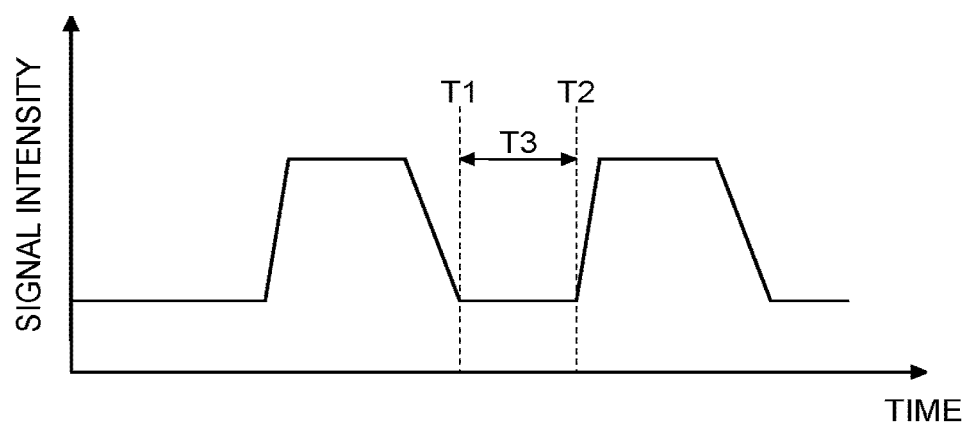
FIG. 28 is a waveform chart representing an example of a waveform of a detection signal detected by the photo diode during the movements illustrated in FIG. 27.

In each of the drive systems 100 and 200 in the above embodiments, the gains are increased until the numbers of times the respective photo diodes 151 (equivalent to the PD 951 in FIG. 14) and 152 (equivalent to the PD-X 952 in FIG. 14) as photodetectors have detected light that has entered therein become at least the specified numbers of times. However, as illustrated in FIG. 27 and FIG. 28, each of the drive systems 100 and 200 may be configured so that, when the laser scanning follows a trajectory such that light enters the photo diode 151 or 152 in short cycles outside the image formation region (refer to FIG. 14), the gain can be increased until a time difference T3 (refer to FIG. 28) between a time T1 and a time T2 becomes larger than a predetermined value. The time T1 is when light having entered the photo diode 151 or 152 at an earlier time (in an outgoing movement) passes out of the photo diode 151 and 152. The time T2 is when the light comes back to enter the photo diode 951 or 952 at a later time (in an incoming movement). Consequently, the energy-saving effect is further improved by setting the margins equal to or more than predetermined values in the setup stage and by decreasing a voltage value when the margins have become too large because of passage of time. In addition, each of the drive systems 100 and 200 may be configured so that, when it is impossible to increase the margin beyond the predetermined value even with the corresponding gain having been maximized, a control device can output failure information with the assumption that a failure has occurred.

The controller 150 in each of the above embodiments may enter a check mode, that is, again perform the amplitude adjustment described in the above embodiments when having acquired information indicating that the ambient temperature has changed or when a predetermined time period has passed since the start-up. Consequently, the amplitudes can be kept stable even when the amplitudes have changed because of a change in the surrounding environment or because of passage of time.

Figure 29:
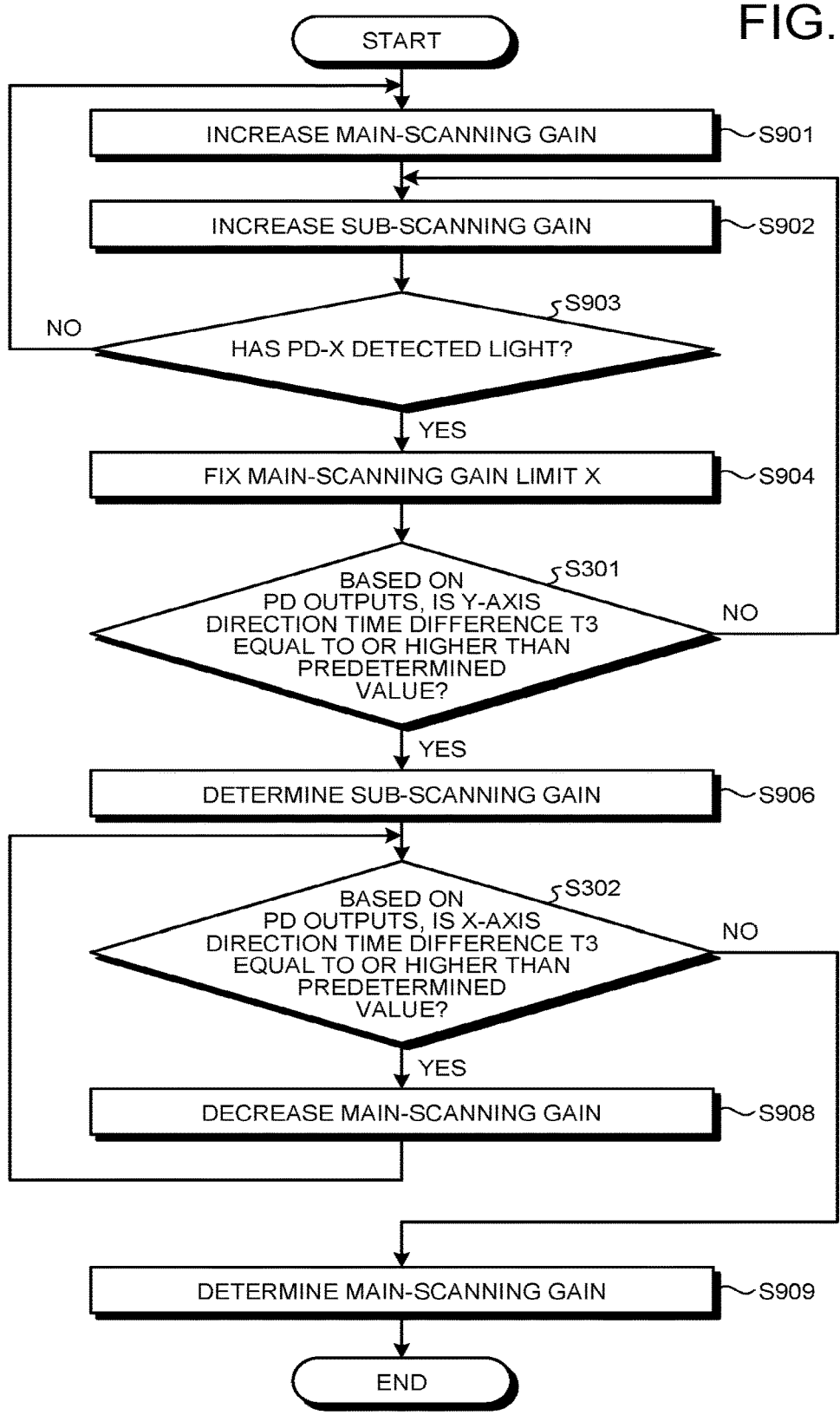
FIG. 29 is a flowchart illustrating another example of operation that each controller in the first to the fourth embodiments of the present invention performs.

Here, with reference to FIG. 29, description is given of a procedure to be taken until main scanning and sub scanning reach steady states in the configuration set so that, as illustrated in FIG. 27 and FIG. 28, the gain can be increased until a time until light having passed out of the photo diode 151 or 152 enters that photo diode 151 or 152 (the time difference T3) again becomes larger than a predetermined value. FIG. 29 is a flowchart illustrating an example of operation that the controller performs until main scanning and sub scanning reach steady states. The operation illustrated in FIG. 29 is the same operation as that illustrated above with reference to FIG. 15 except that Step S905 and Step S907 in FIG. 15 are replaced with Step S301 and Step S302, respectively.

At Step S301 in FIG. 29, the controller 150 uses detection signals acquired from the photo diode 152 to find, from the time T1 when light having entered the photo diode 152 at an earlier time (in an outgoing movement) passes out of the photo diode 152 and the time T2 when the light comes back to enter the photo diode 152 at a later time (in an incoming movement), the time difference (a Y-axis direction time difference) T3 between these times. The controller 150 then continues until the Y-axis direction time difference T3 becomes equal to or larger than a predetermined value, that is, until sub scanning reaches an amplitude including the margin Y (NO at Step S301). Thereafter, when sub scanning has reached the amplitude including the margin Y (YES at Step S301), the operation proceeds to Step S906, where the gain of sub scanning is determined and the amplitude thereof is fixed. Detection signals acquired from the photo diode 152 contain noise. The controller 150 therefore may take out, from acquired signals, signals having values larger than a predetermined value as the detection signals to find the above Y-axis direction time difference T3.

At Step S302 in FIG. 29, the controller 150 uses detection signals acquired from the photo diode 151 to find, from the time T1 when light having entered the photo diode 151 at an earlier time (in an outgoing movement) passes out of the photo diode 151 and the time T2 when the light comes back to enter the photo diode 151 at a later time (in an incoming movement), the time difference (an X-axis direction time difference) T3 between these times. If the X-axis direction time difference T3 is smaller than a predetermined value (NO at Step S302), the controller 150 determines the gain to be as it is and fixes the amplitude (Step S909), and the operation is ended. On the other hand, if the X-axis direction time difference T3 is equal to or larger than the predetermined value (YES at Step S302), the amplitude is decreased to a value including the margin X from the limit when the amplitude of sub scanning is determined (Step S908), and the operation returns to Step S302. The operation as described above causes main scanning and sub scanning to reach steady states as in the cases of the operation described with reference to FIG. 16 and FIG. 17. As in the case of detection signals acquired from the photo diode 152, detection signals acquired from the photo diode 151 contain noise. The controller 150 therefore may take out from acquired signals, as the detection signals, signals having values larger than a predetermined value and find the X-axis direction time difference T3 described above. The steps of the operation other than the Steps S301 and S302 are the same as those of the operation described with reference to FIG. 15, and redundant description is omitted herein.

In addition, with regard to the configuration described with reference to FIG. 27, the case in which an optical scanning path goes out from and then back into the same photo diode 151 or 152 outside the image formation region (refer to FIG. 14) is given as an example. However, this configuration is not limiting. For example, in each of the above described embodiments, it is also possible to employ another configuration in which two photo diodes as photodetectors are provided in proximity to each other so that light can enter these two photo diodes consecutively while taking an outgoing part or an incoming part of the path one time. Such a configuration may be set so that the gain can be increased until a time difference T6 between a time T4 when one (for example, a PD located more upstream in the scanning path) of the photo diodes receives light and a time T5 when the other photo diode (for example, a PD located more downstream in the scanning path) receives light becomes smaller than a predetermined value.

Consequently, the energy-saving effect is further improved by setting the margin for the time difference T6 to a value equal to or larger than a predetermined value in the setup stage and by decreasing a voltage value when the margin has become too large because of passage of time. In addition, each of the drive systems 100 and 200 may be configured so that, when it is impossible to increase the margin to a value equal to or larger than the predetermined value even with the corresponding gain having been maximized, a control device can output failure information with the assumption that a failure has occurred.

Figure 30:
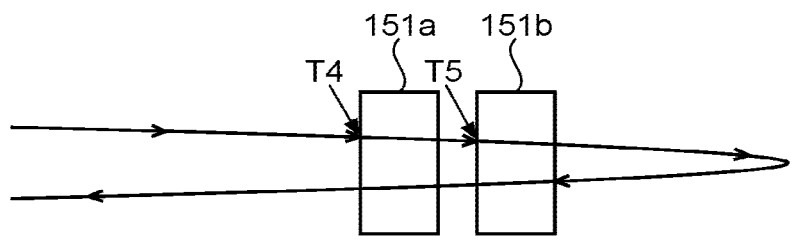
FIG. 30 is a diagram for explaining a case in which laser light enters two photo diodes provided in proximity to each other outside an image formation region during movements for forming a two-dimensional image by using any one of the piezoelectric actuator according to the first to fourth embodiments of the present invention.
Figure 31:
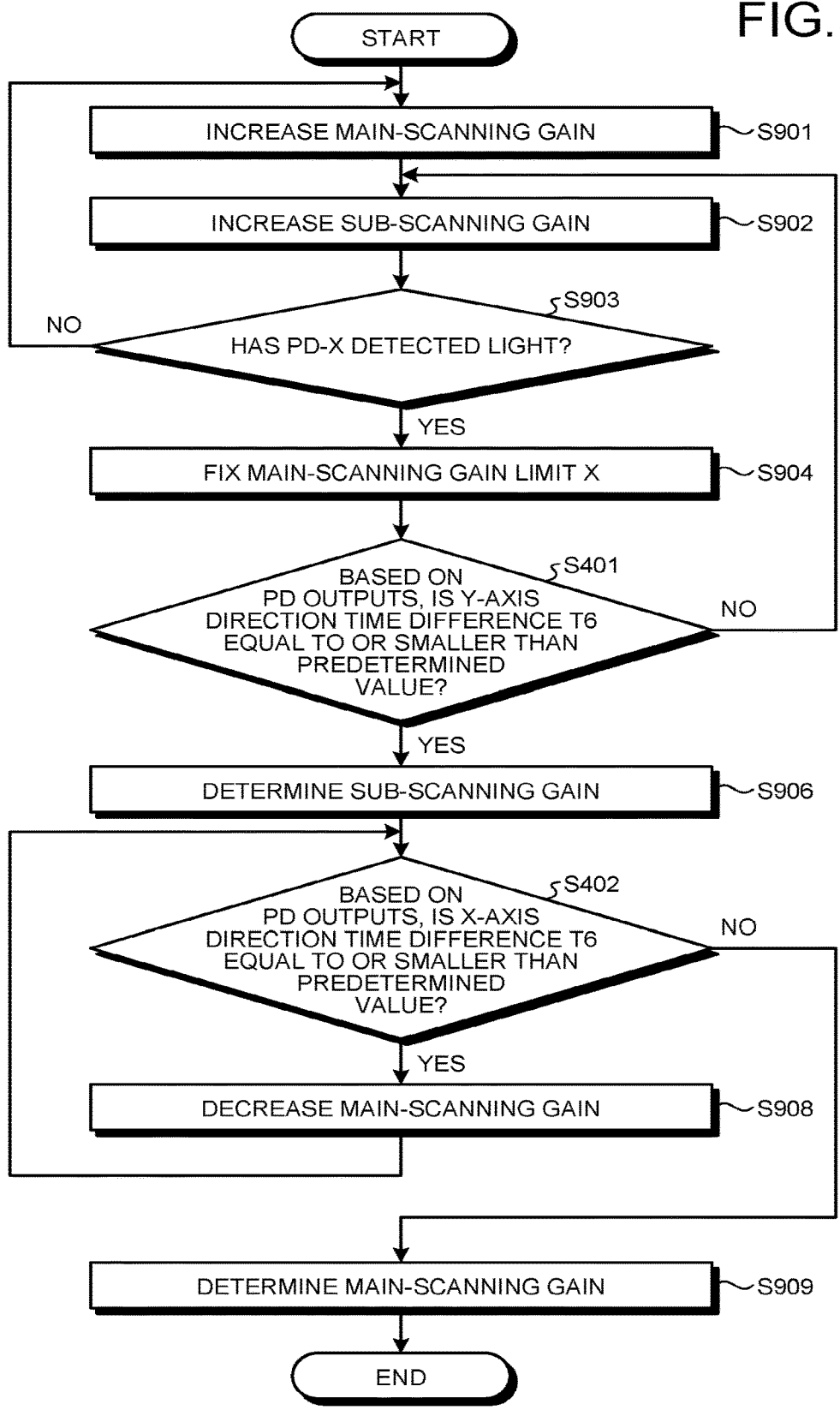
FIG. 31 is a flowchart illustrating still another example of operation that each controller in the first to the fourth embodiments of the present invention performs.

Here, with reference to FIG. 30 and FIG. 31, description is given of a procedure to be taken until main scanning and sub scanning reach steady states in a configuration set so that a gain can be increased until a time difference (a time difference T6) between light entrance times when light enters the respective two photo diodes provided in proximity to each other becomes larger than a predetermined value. FIG. 30 is a diagram for explaining an example of the case in which two photo diodes as photodetectors are provided in proximity to each other. The time difference T6 is a time difference between a time T4 when one (for example, a PD 151a located more upstream in a scanning path) of the photo diodes receives light and a time T5 when the other photo diode (for example, a PD 151b located more downstream in the scanning path). In FIG. 30, the photo diodes 151a and 151b are equivalent to the photo diode 151 or 152 in FIG. 19 or FIG. 21. That is, in this explanation, each of the photo diodes 151 and 152 in each of the above embodiments is composed of the two photo diodes 151a and 151b.

FIG. 31 is a flowchart illustrating an example of operation that the controller performs until main scanning and sub scanning reach steady states. The operation illustrated in FIG. 31 is the same operation as that described above with reference to FIG. 15 except that Step S905 and Step S907 in FIG. 15 are replaced with Step S401 and Step S402, respectively.

At Step S401 in FIG. 31, the controller 150 uses detection signals acquired from the photo diode 151a and detection signals acquired from the photo diode 151b to find the time T4 when light enters the photo diode 151a and the time T5 when the light enters the photo diode 151b, and calculates the time difference (a Y-axis direction time difference) T6 between the times T4 and T5. The controller 150 then continues until the calculated time difference T6 becomes equal to or smaller than a predetermined value, that is, until sub scanning reaches a value including the margin Y (NO at Step S401). Thereafter, when sub scanning has reached the amplitude including the margin Y (YES at Step S401), the operation proceeds to Step S906, where the gain of sub scanning is determined and the amplitude thereof is fixed. Detection signals acquired from the photo diodes 151a and 151b contain noise. The controller 150 therefore may take out from acquired signals, as the detection signals, signals having values larger than a predetermined value and find the above Y-axis direction time difference T6.

At Step S402 in FIG. 31, the controller 150 uses detection signals acquired from the photo diodes 151a and 151b to find, for the amplitude of main scanning, the time T4 when light enters the photo diode 151a and the time T5 when the light enters the photo diode 151b and calculates the time difference (an X-axis direction time difference) T6 between the times T4 and T5. If the X-axis direction time difference T6 is more than a predetermined value (NO at Step S402), the controller 150 fixes the amplitude by determining the gain to be as it is (Step S909), and the operation is ended. On the other hand, if the X-axis direction time difference T6 is equal to or smaller than the predetermined value (YES at Step S402), the amplitude is decreased to a value including the margin X from the limit at the same time as the amplitude of sub scanning is determined (Step S908), and the operation returns to Step S402. The operation as described above causes main scanning and sub scanning to reach steady states as in the cases of the operation described with reference to FIG. 16 and FIG. 17. Detection signals acquired from the photo diodes 151a and 151b contain noise as in the case of signals acquired from the photo diode 152. The controller 150 therefore may find the above X-axis direction time difference T6 by taking out from acquired signals, as detection signals, signals having values larger than a predetermined value. The steps of the operation other than the Steps S401 and S402 are the same as those in the operation described with reference to FIG. 15, and redundant description is omitted herein.

Figure 32:
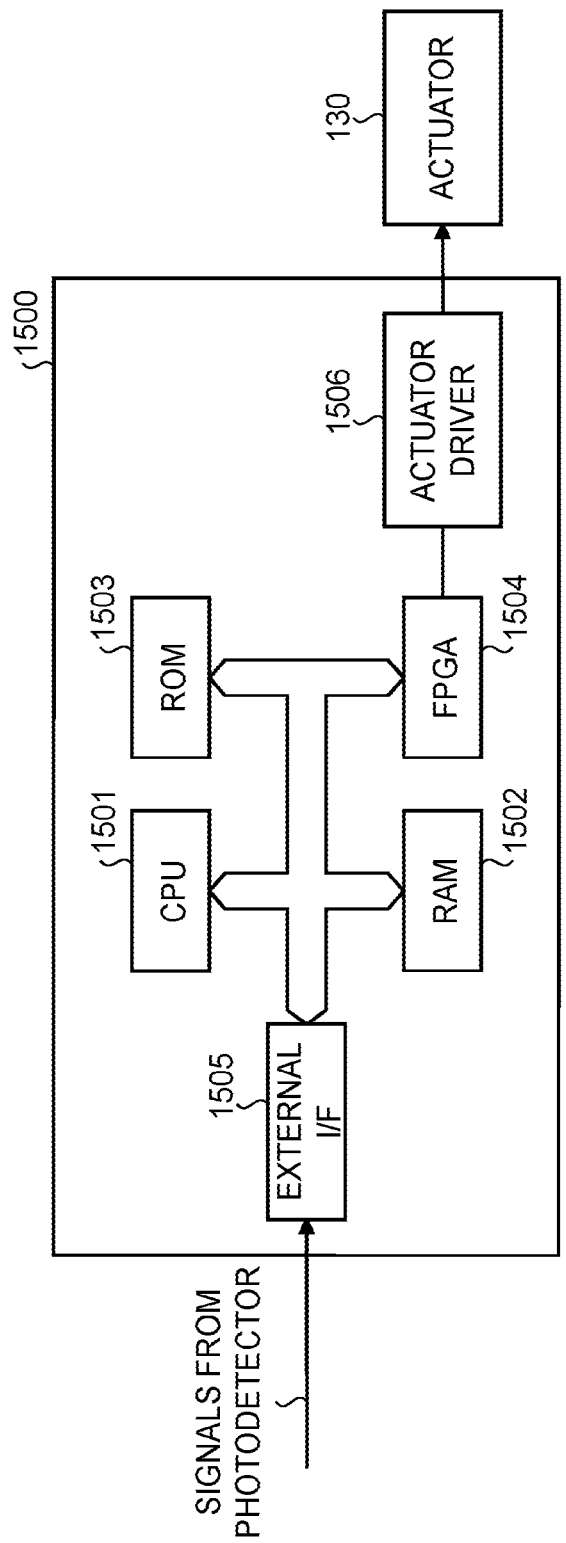
FIG. 32 is a block diagram illustrating an example of a schematic configuration of each actuator controlling device according to the first to the fourth embodiments of the present invention.

In addition, a configuration obtained by excluding the actuator 130 from the configuration of each of the drive systems 100 and 200 in the above embodiments is also referred to as an actuator controlling device. FIG. 32 illustrates an example of a schematic configuration of the actuator controlling device. As illustrated in FIG. 32, an actuator controlling device 1500 includes a central processing unit (CPU) 1501, a random access memory (RAM) 1502, a read only memory (ROM) 1503, a field-programmable gate array (FPGA) 1504, an external interface (I/F) 1505, and an actuator driver 1506. Of these components of the configuration, the CPU 1501, the RAM 1502, the ROM 1503, and the external I/F 1505 form, for example, the controller 150 (refer to FIG. 19 and FIG. 21, for example) in the above description. The FPGA 1504 is equivalent to the above waveform generating unit 110, and the actuator driver 1506 is equivalent to, for example, the main-scanning driving amplifier 121, the sub-scanning driving amplifier 123, and the power supply unit 160 in FIG. 19 or the main-scanning driving amplifier 121, the sub-scanning driving amplifier 123, and the two power supply units 261 and 262 in FIG. 21.

The CPU 1501 is an arithmetic device that implements the control and functions of the controller 150 as a whole by loading computer programs and data from a storage device such as the ROM 1503 into the RAM 1502 and executing processing. The RAM 1502 is a volatile storage device that temporarily retains computer programs and data. The ROM 1503 is a non-volatile storage device capable of retaining computer programs and data even after power-off, and stores therein computer programs and data that are used for processing to be executed by the CPU 1501 for controlling individual functions of the drive system 100 or 200. At least one of the RAM 1502 and the ROM 1503 has the function of a storage unit that stores therein parameters related to the control and signals acquired from the photodetectors (such as the PD 151 and the PD-X 152).

The FPGA 1504 is a circuit that outputs appropriate control signals to the actuator driver 1506 in accordance with processing executed by the CPU 1501, and has the function of the above waveform generating unit 110. The external I/F 1505 is, for example, an interface for communication with external apparatuses, a network, or the like. The external apparatuses include, for example, higher-level devices such as a photodetector (such as the PD 151 or the PD-X 152) and a personal computer (PC), and storage devices such as a universal serial bus (USB) memory, a Secure Digital (SD) card, a compact disc (CD), a digital versatile disc (DVD), a hard disk drive (HDD), and a solid state drive (SSD). The network is, for example, a controller area network (CAN) of an automobile, a local area network (LAN), or the Internet. The external I/F 1505 may have any configuration that enables connection or communication with external apparatuses, and the external I/F 1505 may be provided for each of the external apparatus.

The actuator driver 1506 is equivalent to, for example, the main-scanning driving amplifier 121, the sub-scanning driving amplifier 123, and the power supply unit 160 in FIG. 19 or the main-scanning driving amplifier 121, the sub-scanning driving amplifier 123, and the two power supply units 261 and 262 in FIG. 21 as described above, and is an electrical circuit that amplifies signals input from the FPGA 1504 using amplifiers (such as the AMP 121 and the AMP 123) and outputs the amplified signals to the actuator 130. The actuator driver 1506 may be embedded in the FPGA 1504.

In the actuator controlling device 1500, the CPU 1501 acquires signals from the photo diodes 151 and 152 through the external I/F 1505. The actuator controlling device 1500 according to each of the above embodiments is capable of implementing the functional configuration explained above by instructions from the CPU 1501 and the hardware configuration illustrated in FIG. 32.

According to the present invention, it is possible to reduce variation in driving sensitivity among actuators.

The above-described embodiments are illustrative and do not limit the present invention. Thus, numerous additional modifications and variations are possible in light of the above teachings. For example, at least one element of different illustrative and exemplary embodiments herein may be combined with each other or substituted for each other within the scope of this disclosure and appended claims. Further, features of components of the embodiments, such as the number, the position, and the shape are not limited the embodiments and thus may be preferably set. It is therefore to be understood that within the scope of the appended claims, the disclosure of the present invention may be practiced otherwise than as specifically described herein.

The method steps, processes, or operations described herein are not to be construed as necessarily requiring their performance in the particular order discussed or illustrated, unless specifically identified as an order of performance or clearly identified through the context. It is also to be understood that additional or alternative steps may be employed.

Each of the functions of the described embodiments may be implemented by one or more processing circuits or circuitry. Processing circuitry includes a programmed processor, as a processor includes circuitry. A processing circuit also includes devices such as an application specific integrated circuit (ASIC), digital signal processor (DSP), field programmable gate array (FPGA) and conventional circuit components arranged to perform the recited functions.

What is claimed is:

1. A device for controlling an actuator, the device comprising:
  a photodiode configured to detect light and generate signals based on the light detected; and
  processing circuitry configured to:
    generate a voltage waveform,
    control power to an amplifier to amplify the generated voltage waveform,
    acquire the signals from the photodiode and control, based on the acquired signals, the power supplied for the amplification of the generated voltage waveform,
    input the amplified voltage waveform having a sawtooth shape into the actuator for scanning in a sub-scanning direction, and
    input another amplified voltage waveform having a sinusoidal shape into the actuator for scanning in a main-scanning direction.

2. The device according to claim 1, wherein the processing circuitry is further configured to:
  cause a reflecting part to rotate about a first axis and a second axis,
  supply first power to a first amplifier and supply second power to a second amplifier, and
  control the first power and the second power independently.

3. The device according to claim 1, wherein the processing circuitry is further configured to acquire, from the photodiode, the signals having signal intensity higher than a predetermined value and control, based on the acquired signals, voltage to be supplied to amplifiers.

4. The device according to claim 1, wherein, when a number of times the circuitry has acquired the signals from the photodiode exceeds a predetermined value, the processing circuitry is further configured to fix voltage to be supplied to amplifiers.

5. The device according to claim 1, wherein the processing circuitry is further configured to:
  measure times when the signals are acquired from the photodiode, and
  after having received at least first and second signals from the photodiode on a condition that a time difference between times when the first and second signals are acquired is equal to or larger than a predetermined value, fix voltage to be supplied to amplifiers.

6. The device according to claim 5, wherein, when the processing circuitry apply a maximum applicable voltage, when the time difference does not exceed the predetermined value, the processing circuitry is further configured to output a failure signal with an assumption that a failure has occurred in the actuator.

7. A drive system comprising:
  the device according to claim 1; and
  the actuator.

8. A video device comprising the drive system according to claim 7.

9. An image projection device comprising:
  the drive system according to claim 7;
  a mirror attached to the actuator and capable of rotating in directions of two axes;
  a light source to output a laser beam;
  an optical system to make the laser beam to be incident on the mirror; and
  a controller to drive the mirror by controlling the drive system.

10. The image projection device according to claim 9, wherein
  the actuator includes a supporting part to support the mirror,
  the supporting part includes a plurality of joists that continue from one to another in a meandering form, and a plurality of piezoelectric members provided individually on respective laser beams, and
  the drive system applies two kinds of voltage individually and in parallel to respective two piezoelectric members individually provided to two neighboring ones of the joists, the two kinds of voltage having different waveforms that are not similar to each other.

11. A method for controlling an actuator, the method comprising:
  detecting light and generating signals based on the light detected by a photodiode;
  generating, by processing circuitry, a voltage waveform;
  controlling power to an amplifier to amplify the generated voltage waveform;
  acquiring the signals from the photodiode and control, based on the acquired signals, the power supplied for the amplification of the generated voltage waveform;
  inputting the amplified voltage waveform having a sawtooth shape into the actuator for scanning in a sub-scanning direction; and
  inputting another amplified voltage waveform having a sinusoidal shape into the actuator for scanning in a main-scanning direction.

* * * * *